United States Patent
Kelly et al.

(10) Patent No.: US 11,251,126 B2
(45) Date of Patent: Feb. 15, 2022

(54) REPLACEMENT METAL CAP BY AN EXCHANGE REACTION

(71) Applicant: International Business Machines Corporation, Armonk, NY (US)

(72) Inventors: James J. Kelly, Schenectady, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/819,948

(22) Filed: Mar. 16, 2020

(65) Prior Publication Data

US 2020/0219817 A1 Jul. 9, 2020

Related U.S. Application Data

(63) Continuation of application No. 16/103,306, filed on Aug. 14, 2018, now Pat. No. 10,651,125.

(51) Int. Cl.
*H01L 23/532* (2006.01)
*H01L 21/768* (2006.01)
*H01L 21/288* (2006.01)

(52) U.S. Cl.
CPC .. *H01L 23/53209* (2013.01); *H01L 21/76802* (2013.01); *H01L 21/76847* (2013.01); *H01L 21/76849* (2013.01); *H01L 21/76877* (2013.01)

(58) Field of Classification Search
CPC ......... H01L 21/76877; H01L 21/76802; H01L 21/76847; H01L 21/76849; H01L 21/76807; H01L 23/53266; H01L 23/485; H01L 23/53295; H01L 21/76843; H01L 21/28562; H01L 23/528
See application file for complete search history.

(56) References Cited

U.S. PATENT DOCUMENTS

| | | | |
|---|---|---|---|
| 8,080,475 | B2 | 12/2011 | RamachandraRao et al. |
| 8,298,948 | B2 | 10/2012 | Bonilla et al. |
| 9,111,938 | B2 | 8/2015 | Baumann et al. |
| 9,275,898 | B1 | 3/2016 | Shu et al. |
| 9,576,901 | B1 | 2/2017 | Chen et al. |
| 9,865,543 | B1 | 1/2018 | Fang et al. |
| 2014/0057435 | A1 | 2/2014 | Zhang et al. |
| 2015/0235957 | A1* | 8/2015 | Zhang ............... H01L 21/31144 257/751 |
| 2017/0047249 | A1 | 2/2017 | Emesh et al. |
| 2020/0168504 | A1* | 5/2020 | Kamineni ............ H01L 29/456 |

OTHER PUBLICATIONS

Non-Final Office Action for U.S. Appl. No. 16/103,306, filed Sep. 4, 2019.
List of IBM Patents or Patent Applications Treated as Related.

* cited by examiner

*Primary Examiner* — Sonya McCall-Shepard
(74) *Attorney, Agent, or Firm* — Fleit Intellectual Property Law; Jose Gutman

(57) ABSTRACT

Various methods and structures for fabricating BEOL metallization layer including at least one bulk cobalt contact, the at least one bulk cobalt contact including a replacement non-cobalt metal cap integral to the at least one bulk cobalt contact. The method includes performing selective deposition, by a chemical exchange reaction of metal between a non-cobalt metal and Cobalt in the at least one bulk cobalt contact, of the replacement non-cobalt metal cap integrally formed in a top surface region of the bulk cobalt contact.

11 Claims, 18 Drawing Sheets

REPLACEMENT METAL CAP BY AN EXCHANGE REACTION

BACKGROUND

The present invention generally relates to the field of semiconductors, and more particularly relates to a method of fabricating metallization structures, BEOL metallization layers, and the like, on semiconductor substrates.

Semiconductor wafers, chips, devices, and the like, whether including analog or digital electronic circuits, typically rely on at least one metallization layer disposed on a semiconductor substrate to provide electronic interconnections between circuits on the semiconductor substrate or layer. Some circuit designs use a plurality of metallization layers stacked on top of one another. A metallization layer may also be referred to as a back-end-of-line (BEOL) metallization layer which could be disposed on a semiconductor material stack. Semiconductor contacts in a top layer in the semiconductor material stack are electrically connected to metal contacts and metal interconnects in a metallization layer disposed on the semiconductor material stack.

As chip designs continue to miniaturize on-chip electronic device dimensions to increase feature density, such chip designs attempt to locate electronic devices, and accordingly device features, closer and closer to each other on a semiconductor chip. As device features are located closer to each other, the respective metal interconnection wires are smaller widths and separated from each other by smaller pitch values and tighter pitch tolerances (pitch variability), to meet chip design requirements. As pitch values between adjacent features become much smaller with tighter pitch tolerances, conventional metal interconnection wires using metals such as Copper or Aluminum, experience fabrication processing problems to meet the smaller metal interconnection wire width and pitch requirements. For example, barriers between such wires at such small dimensions have been reaching their design limits. Also, at smaller wire width and pitch dimensions Copper wires, for example, can become unreliable for carrying electrical current at a specified design requirement. To provide an electrical current, the moving electrons in such extremely small scale Copper wires can vary the resistance of the wires for certain applications. These types of limitations of metal interconnection wire design, at continuously smaller scale circuit designs, have created a challenge for circuit designers and for semiconductor fabrication process designers to continue to meet further miniaturization goals.

SUMMARY OF THE INVENTION

Various embodiments of the present invention include fabrication of semiconductor structure comprising: a substrate; and a BEOL metallization layer disposed on the substrate, the BEOL metallization layer including at least one bulk cobalt contact, the at least one bulk cobalt contact including a replacement non-cobalt metal cap integral to the at least one bulk cobalt contact.

A semiconductor fabrication method and semiconductor structure, for example, can form one or more back-end-of-line (BEOL) metallization layers on a semiconductor stack, on a semiconductor chip. According to various embodiments, provided is a method for fabricating a metal contact for a semiconductor structure, the method comprising: providing a semiconductor stack disposed on a circuit supporting substrate; patterning a top layer of the semiconductor stack to provide a semiconductor contact; deposition of Cobalt fill in a first BEOL metallization layer disposed directly on the semiconductor stack thereby providing a bulk cobalt contact in the first BEOL metallization layer, wherein the bulk cobalt contact being disposed directly on the semiconductor contact; perform selective deposition, by a chemical exchange reaction of metal between a non-cobalt metal and Cobalt in the bulk cobalt contact, of a replacement non-cobalt metal cap integrally formed in a top surface region of the bulk cobalt contact; and perform deposition of a metal fill in a trench in a second BEOL metallization layer disposed directly on the first BEOL metallization layer, the metal fill forming a metal contact for the semiconductor contact, the metal contact disposed on the replacement non-cobalt metal cap integrally formed in the top surface region of the bulk cobalt contact in the first BEOL metallization layer. Also, the method can include performing, prior to the deposition of the metal fill in the trench in the second BEOL metallization layer, deposition of a conductive liner directly on the replacement non-cobalt metal cap integrally formed in a top surface region of the bulk cobalt contact, the metal fill being disposed directly on the conductive liner and providing the metal contact for the at least one semiconductor contact.

In various embodiments, the replacement non-cobalt metal cap comprises at least one metal selected from the following set of metals: Copper (Cu); Ruthenium (Ru); Rhodium (Rh); Platinum (Pt); Iridium (Ir); Osmium (Os); Palladium (Pd); or Rhenium (Re).

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
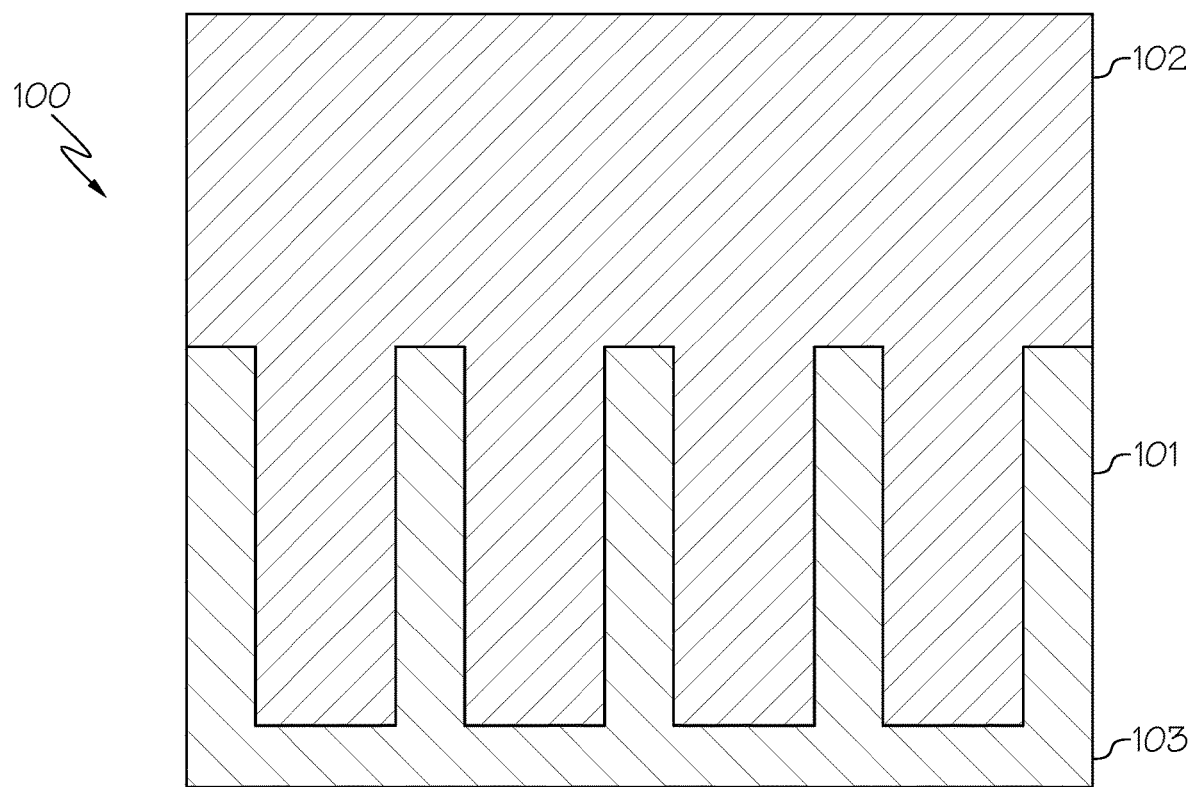
FIG. 1 is a cross-sectional side view of an example of a partial semiconductor structure illustrating a material stack that can be used in a first example fabrication process, according to an embodiment of the invention.

It is to be understood that the present invention will be described in terms of illustrative example processes for fabricating semiconductor structures and metallization layers in semiconductor chips and wafers. However, many other semiconductor architectures, structures, substrate materials, and process features and steps may be varied within the scope of the present invention.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. Such integrated circuit chips can include analog circuits and devices, digital circuits and devices, or any combination of analog and digital circuits and devices. Such integrated circuit chips may exist in many different embodiments. For example, integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, discrete semiconductor electronic devices, or other signal processing devices, or any combination thereof, as part of either (a) an intermediate product, such as a motherboard or component module, or (b) an end product. The end product can be any product that includes semiconductor integrated circuits and/or CMOS integrated circuits, ranging from toys and other low-end applications to advanced computer products and mobile phone devices having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use analog circuits, CMOSs, MOSFETs and/or finFETs technology. By way of non-limiting example, the semiconductor devices can include, but are not limited to analog, CMOS, MOSFET, and finFET devices, and/or semiconductor devices that use analog circuits, CMOS, MOSFET and/or finFET technology.

As used herein, "vertical" refers to a direction perpendicular to a substrate in the cross-sectional and three-dimensional views herein. Current between electronic contacts, whether semiconductor or metal contacts, may be described herein as flowing in a vertical direction (e.g., between a bottom contact or layer and a top contact or layer) through metal interconnection wire. As used herein, "horizontal" refers to a direction parallel to a substrate in the cross-sectional and three-dimensional views herein.

As used herein, "thickness". "thick", or the like, refers to a size of an element (e.g., a layer, trench, via hole, etc.) in the cross-sectional views measured from a bottom surface to a top surface, or from a left side surface to a right side surface of the element, and/or measured with respect to a surface directly adjacent to and contacting the element (e.g., a surface on which the element is directly disposed on).

Unless otherwise specified, as used herein, "height" or "height above a substrate" refers to a vertical size of an element (e.g., a layer, trench, via hole, etc.) in the cross-sectional views measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, etc.), such as a left or right side surface in the cross-sectional views herein.

As used herein, the terms "width" or "width value", and the like, refer to a distance from a start point on a first structure to an end point on the same structure, in a critical dimension. For example, with reference to FIG. 3, a width value of a structure (e.g., one of the replacement non-cobalt metal caps 302) can be measured from a start point on the structure to an end point on the same structure, in a critical dimension. There can be specified a vertical width (e.g., a thickness) of the structure or a horizontal width of the structure.

The inventors have discovered that use of Cobalt material for at least the smaller scale conductor wires, such as in a metallization layer that is disposed on a top layer in a semiconductor stack, can increase performance of the metal wiring in the metallization layer(s) in a semiconductor product. Some circuit designs use a plurality of metallization layers stacked on top of one another. A metallization layer may also be referred to as a back-end-of-line (BEOL) metallization layer which could be disposed on a semiconductor material stack.

Cobalt wiring has a higher melting point than Copper wiring. Cobalt wiring has a higher electro-migration resistance than Copper wiring. Cobalt wiring is therefore easier to use and more reliable to use than Copper, in a semiconductor fabrication process as the scale of circuit designs continue to shrink, such as using wire widths below twenty five nanometers.

The inventors have discovered that reliability of a semiconductor fabrication process can be significantly increased by replacing with Cobalt metal wires the previously popular Copper or Aluminum metal wires, at least at a lower metallization layer near a top layer in a semiconductor stack. Use of Cobalt metal, in particular at an electronic junction (e.g., a metal contact) in the lower metallization layer, will be discussed more fully below.

The width of such Cobalt wiring in an electronic junction can be twenty five nanometers or less. The electronic junction is in direct connection with a semiconductor circuit contact or pad in the semiconductor stack. Electrical signals can be coupled through this electronic junction between the metallization layer wiring and the miniaturized electronic circuits in a semiconductor stack disposed under the metallization layer.

The use of Cobalt as a conductor material in such metallization layer wiring, however, creates certain challenges to a product design, which the inventors have overcome with various embodiments of the present invention as will be discussed below. Cobalt metal can be more reactive than Copper metal. Consequently, Cobalt atoms can migrate to adjacent dielectric material more readily than Copper. Cobalt wiring oxidizes and corrodes faster and can be damaged more quickly than Copper wiring during a fabrication process.

To mitigate at least the problems mentioned above, while scaling continuously smaller semiconductor circuit lines to continue to meet further circuit miniaturization goals, the inventors propose to use in the electronic junction in the metallization layer a bulk cobalt contact including a novel replacement non-cobalt metal cap that is integral to the bulk cobalt contact. Such a replacement non-cobalt metal cap can be formed integral to the bulk cobalt contact by a novel semiconductor fabrication process in which a selective deposition, by a chemical exchange reaction of metal between a non-cobalt metal and Cobalt in the bulk cobalt contact, creates a non-cobalt metal cap integrally formed in a top surface region of the bulk cobalt contact. Examples of this novel semiconductor fabrication process will be discussed in more detail below.

Figure 17:
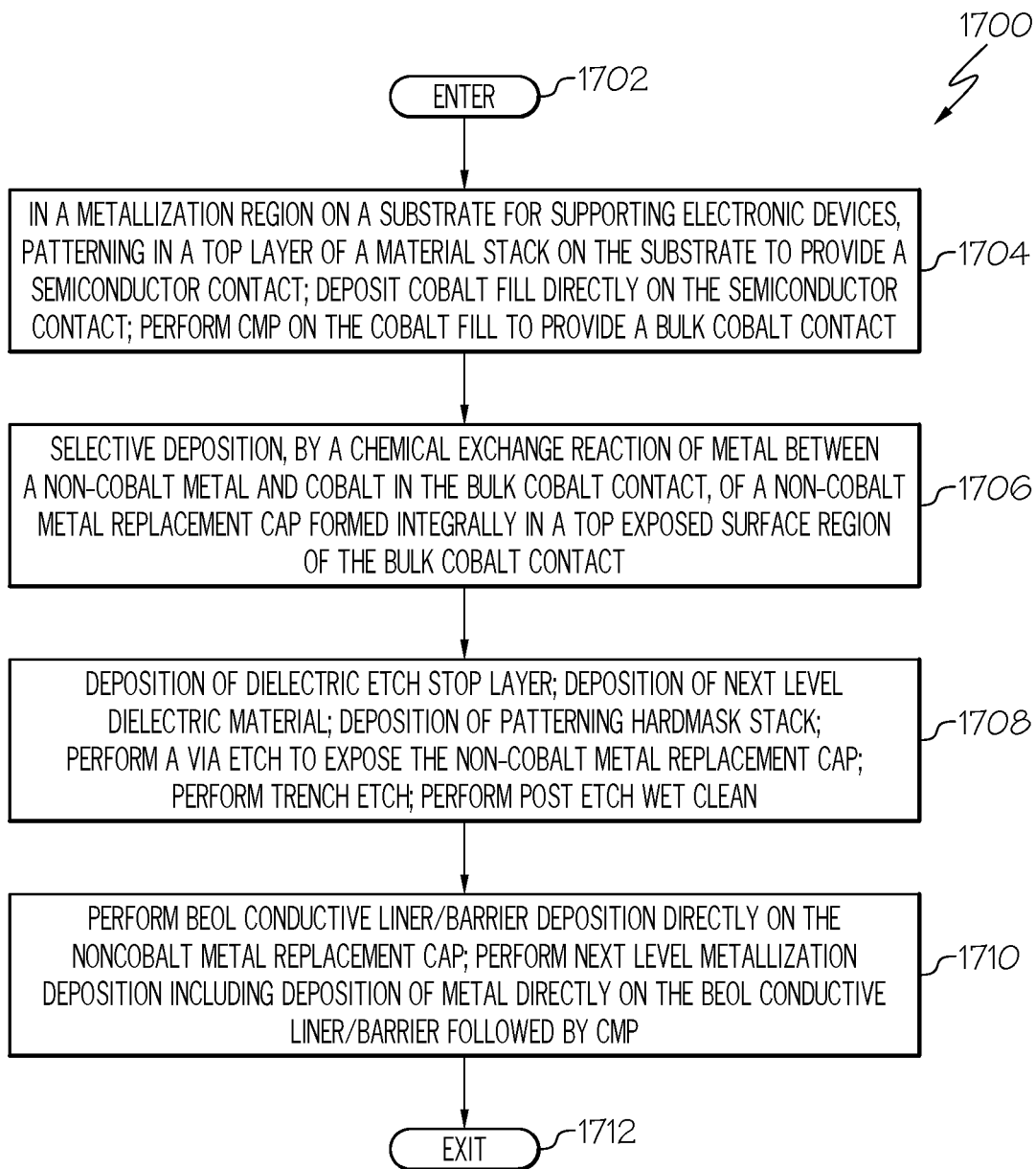
FIG. 17 is an operational flow diagram illustrating the first example fabrication process, according to an embodiment of the invention.

A first example semiconductor fabrication process flow diagram 1700, as shown in FIG. 17, generally corresponds to the process steps shown in FIGS. 1 to 8. In this first example process flow, a replacement non-cobalt metal cap is selectively deposited on the underlying bulk cobalt contact before proceeding to build a next higher level metallization layer.

Figure 18:
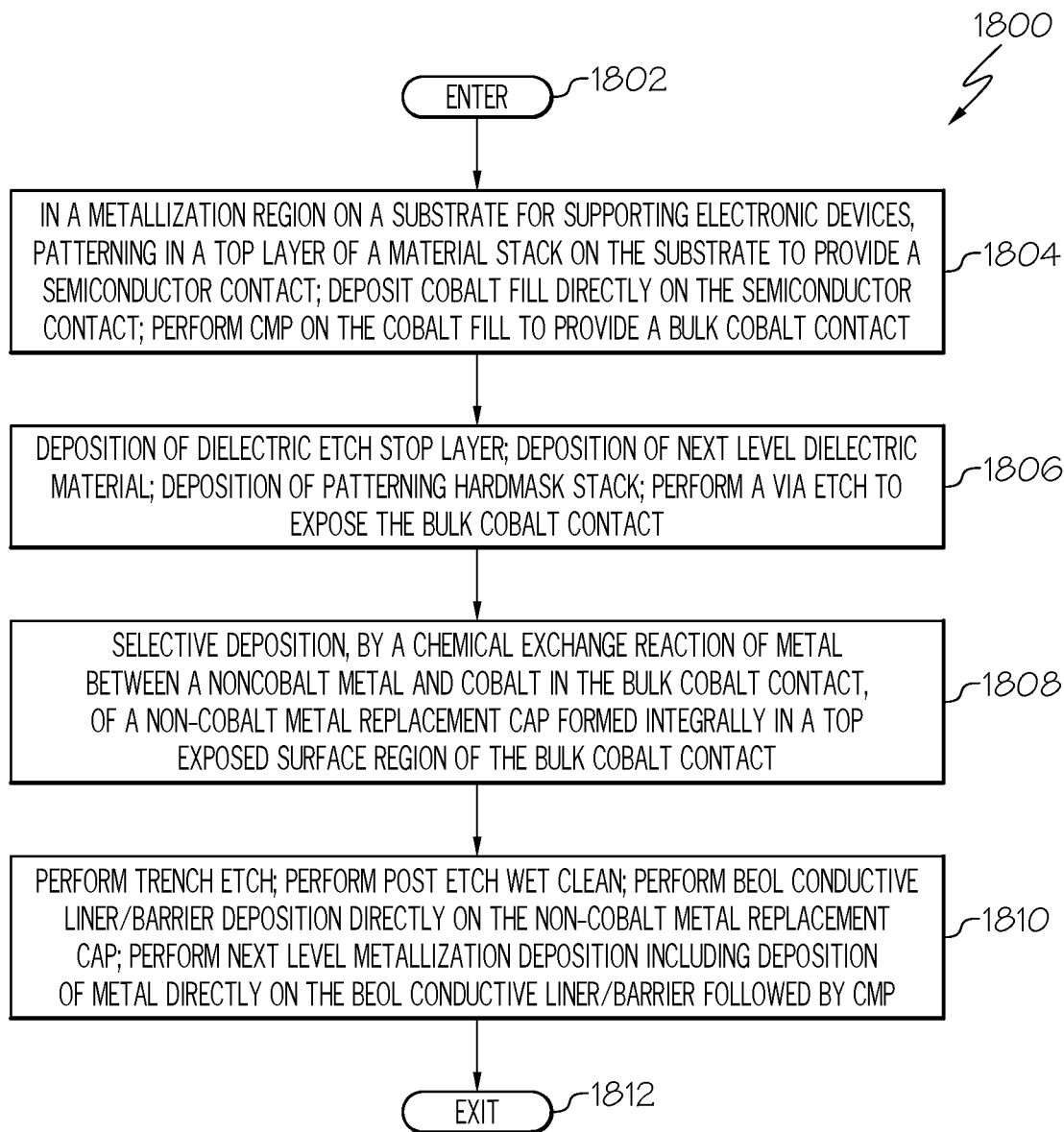
FIG. 18 is an operational flow diagram illustrating the second example fabrication process, according to an embodiment of the invention.

A second example semiconductor fabrication process flow diagram 1800, as shown in FIG. 18, generally corresponds to the process steps shown in FIGS. 9 to 16. In this second example process flow, a replacement metal cap is selectively deposited on the underlying bulk cobalt contact while building a next higher level metallization layer. These two example semiconductor fabrication processes will be discussed below with reference to the corresponding figures.

Referring now to the drawings in which like numerals represent the same or similar elements, FIG. 1 shows an example of a semiconductor structure 100 comprising a material stack 101, 102, 103, suitable for fabrication of various types of semiconductor electronic devices. Layer 103 is shown to illustrate one or more layers, such as a semiconductor substrate layer, a semiconductor material stack, or a semiconductor substrate, according to various embodiments.

In accordance with the first example semiconductor fabrication process, as shown in FIG. 17, the fabrication flow diagram is entered, at step 1702 which then immediately proceeds to step 1704. In a metallization region on a substrate for supporting electronic devices, as shown in FIG. 1, a material layer 101 at a top surface region of a semiconductor material stack 103, according to one example, is patterned with one or more trenches.

According to various embodiments, the substrate may comprise a circuit supporting substrate. A plurality of electronic devices is disposed on the circuit supporting substrate. A first electronic device in the plurality of electronic devices, for example, comprises a first field-effect transistor (FET) and a second electronic device in the plurality of electronic devices comprises a second FET. According to various embodiments of the present invention, an electrical interconnect in a metallization layer on the circuit supporting substrate provides a conductive path for coupling electrical signals between the first FET and the second FET.

The material layer 101 may include, for example, dielectric material such as silicon oxide or carbon-doped oxide, or other low K dielectrics. Various dielectric materials may be used for the patterned top material layer 101, according to various embodiments of the present invention. Such patterning in the material layer 101 may be performed, for example, with a vertical directional etching process. An example of a vertical directional etching process that etches into this material layer 101 is reactive ion etching (RIE) using a fluoride based chemistry (for example, the chemistry could include mixtures of Ar, $CHF_3$, $C_4F_8$ and $CF_4$, etc.). However, there are many alternative vertical etching processes that could be used.

These trenches in the material layer 101 are filled, according to the example, with Cobalt metal fill 102. For example, Cobalt metal can be deposited on the patterned top material layer 101, thereby filling the trenches as shown. Some of the Cobalt metal fill 102 may overflow above the top level of the trenches.

At a top surface region of the semiconductor material stack 103 is provided a semiconductor contact (which may also be referred to as a semiconductor pad, a pad, or the like) within one of the trenches patterned in the top material layer 101. The pad is not shown in FIG. 1. Such semiconductor contact is in direct electrical contact with the bottom surface region of the Cobalt metal fill 102 filling the trench. It should be noted that while there may exist another intervening layer of material (or film) directly on the semiconductor contact or pad, e.g., a pad oxide layer which is not shown, such semiconductor contact is considered in direct electrical contact with the bottom surface region of the Cobalt metal fill 102 filling the trench. The pad oxide layer, for example, could be approximately 30 Å thick.

Figure 2:
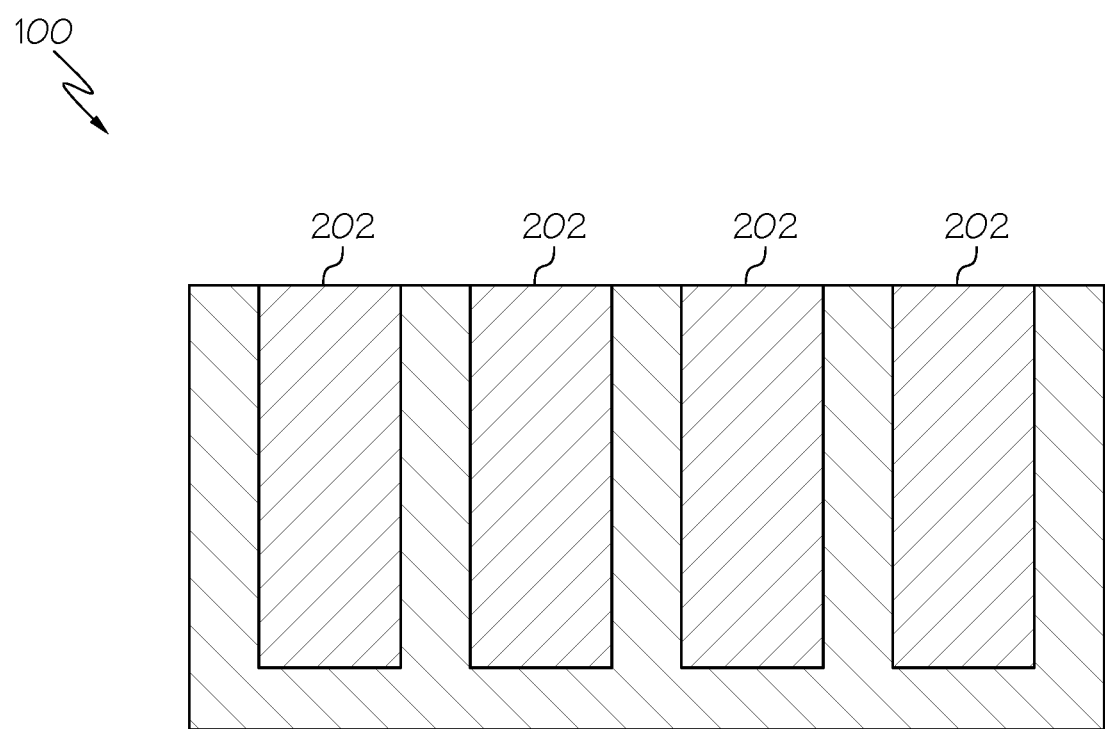
FIG. 2 is a cross-sectional side view of the partial semiconductor structure of FIG. 1 at a subsequent point in the first example fabrication process, according to an embodiment of the invention.

Referring to FIGS. 1 and 2, a fabrication process performs a chemical-mechanical-planarization (CMP) process on the Cobalt metal fill 102 overflowing above the trenches in the material layer 101. The resulting structure is shown in FIG. 2, with one or more trenches filled with the Cobalt metal fill 102 up to the top surface level of the material layer 101. The Cobalt metal fill 102 disposed in a trench and on the semiconductor contact at the top surface region of the semiconductor material stack 103 is also referred to herein as a bulk cobalt contact 202.

The bulk cobalt contact 202 in the trench formed in the top material layer 101 provides a metal contact in a metallization layer which can include the material layer 101 alone or with additional layers. This bulk cobalt contact 202 is a conductive metal contact for the semiconductor contact or pad at the top surface region of the semiconductor material stack 103.

The semiconductor contact provides a conductive path for electrical current to flow vertically between a semiconductor circuit in the semiconductor material stack 103 and the bulk cobalt contact 202 in the metallization layer disposed above the material stack 103. The semiconductor contact and the bulk cobalt contact 202 are dimensioned to a similar width according to a miniaturization scale of line width in the semiconductor circuit in the underlying semiconductor stack 103.

Figure 3:
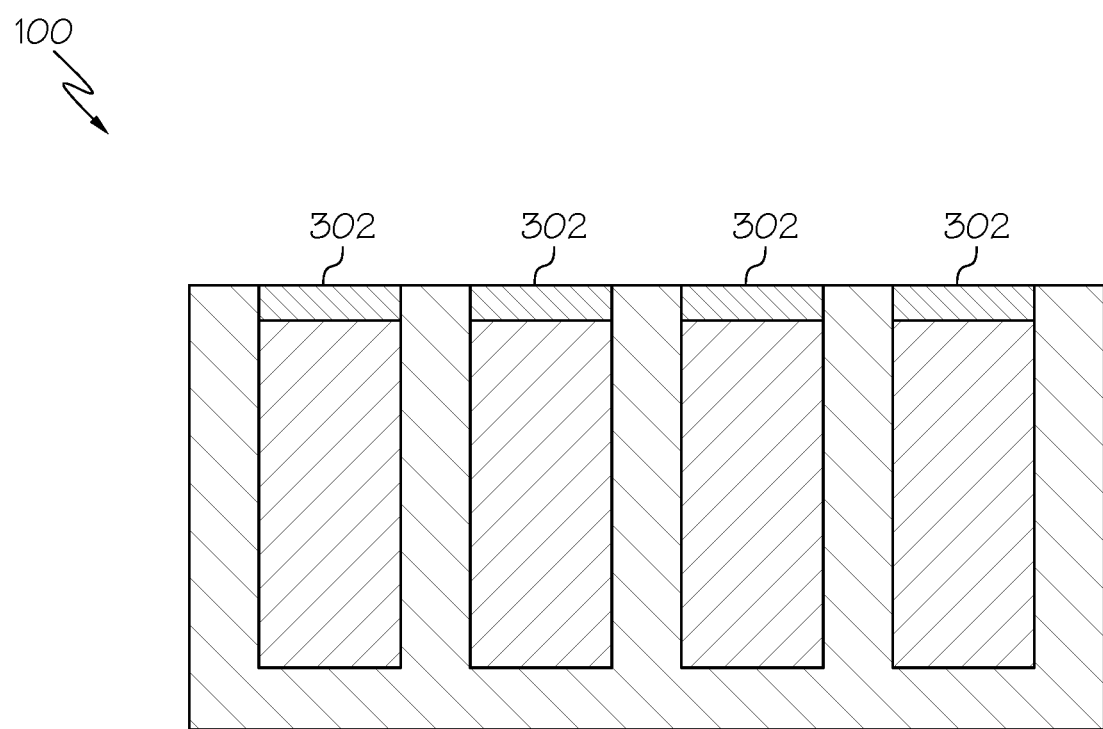
FIG. 3 is a cross-sectional side view of the partial semiconductor structure of FIG. 2 at a subsequent point in the first example fabrication process illustrating formation, by a chemical exchange reaction of metal between a non-cobalt metal and Cobalt in a bulk cobalt contact, of a non-cobalt metal cap integrally formed in a top surface region of the bulk cobalt contact, according to an embodiment of the invention.

Referring to FIGS. 2 and 3, and to step 1706 in FIG. 17, the first example semiconductor fabrication process proceeds to perform selective deposition of a non-cobalt metal cap 302 (which may be also referred to as a replacement non-cobalt metal cap, a replacement metal cap, replacement cap, or the like) integrally formed in a top surface region of the bulk cobalt contact 202, as shown in FIG. 3. This selective deposition can be performed by a chemical exchange reaction of metal between a non-cobalt metal and Cobalt metal in the bulk cobalt contact 202, as will be further described below.

A wet chemical solution, according to one example process, contains a metal species that is more noble (less reactive) than Cobalt metal. The metal species, obviously, would be a metal that is other than Cobalt metal. A wet chemistry in the chemical solution includes metal ions of the more noble metal species. Examples of metal species more noble (less reactive) than Cobalt include, but are not limited to: Copper, Ruthenium, Rhodium, Platinum, Iridium, Osmium, Palladium, or Rhenium.

While the present example is discussed using only one nobler non-cobalt metal species in the wet chemical solution, it should be clear that a plurality of nobler non-cobalt metal species can also be used in a wet chemical solution, according to various embodiments of the invention. That is, a plurality of metal species could take part in the chemical exchange reaction of metal between non-cobalt metal in the wet chemical solution and the Cobalt metal in the bulk cobalt contact 202, according to such various embodiments of the invention.

The wet chemical solution containing the metal species, more noble than Cobalt metal, drives the chemical exchange reaction of metal between the non-cobalt metal and the Cobalt metal in the bulk cobalt contact 202. A thin layer (or film) 302 of the nobler non-cobalt metal (also referred to as a non-cobalt metal film) is selectively deposited and integrally formed in a top surface region of the bulk cobalt contact 202, by a metal exchange (or replacement) reaction in which the nobler metal ions in the wet chemical solution are exchanged with, and replace, atoms of Cobalt in the top surface region of the bulk cobalt contact 202. The replaced atoms of Cobalt become ions of Cobalt in the wet chemical solution, and contemporaneously the nobler metal ions become integrally formed in the top surface region of the bulk cobalt contact 202 as a replacement metal cap 302 made of the nobler non-cobalt metal.

This metal exchange chemical reaction is very selective to the Cobalt metal in the bulk cobalt contact 202, in that the non-cobalt nobler metal ions will only exchange one-for-one with the atoms of Cobalt metal in the top surface region of the bulk cobalt contact 202. This metal exchange chemical reaction is also self-limiting. Once the top surface region of the bulk cobalt contact 202 is completely passivated with the film 302 made of the non-cobalt nobler metal, the driving force for the metal exchange chemical reaction subsides. The resulting non-cobalt nobler metal cap 302 protects the underlying Cobalt metal in the bulk cobalt contact 202 and prevents any further metal exchange chemical reaction with the remaining Cobalt metal in the bulk cobalt contact 202.

It should be noted that the non-cobalt metal cap 302 is not deposited "on top of" the top surface of the bulk cobalt contact 202. This metal exchange chemical reaction is very different from other material deposition processes, such as chemical vapor deposition (CVD) or Electroless deposition. The non-cobalt metal cap 302 is integrally formed in the Cobalt metal of the bulk cobalt contact. That is, the non-cobalt metal ions will exchange one-for-one with the atoms of Cobalt in the top surface region of the bulk cobalt contact 202 integrally forming the non-cobalt metal cap 302 in the bulk cobalt contact 202.

Figure 4:
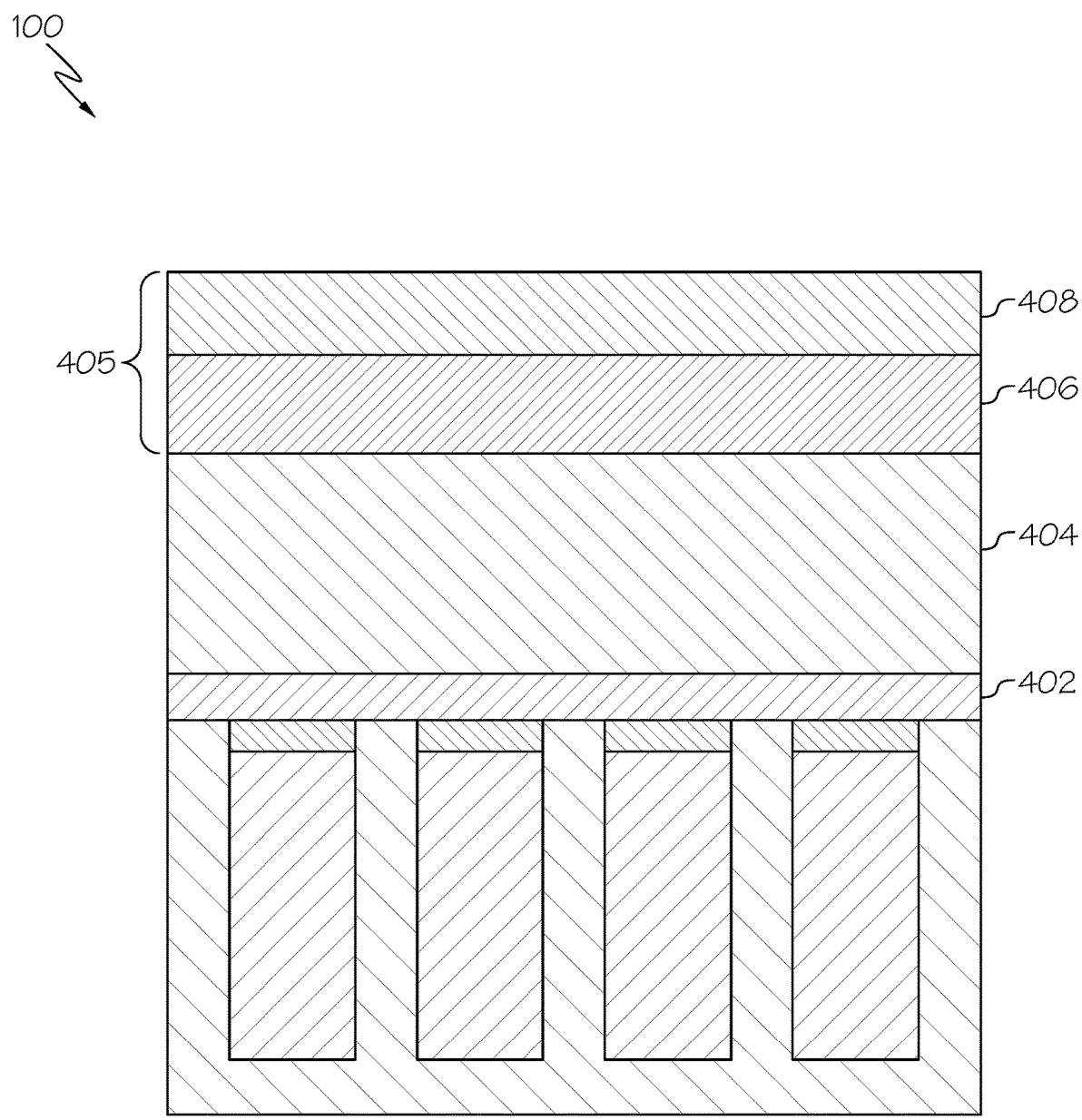
FIG. 4 is a cross-sectional side view of the partial semiconductor structure of FIG. 3 at a subsequent point in the first example fabrication process, according to an embodiment of the invention.

Continuing with the first example fabrication process, with reference to FIG. 4 and to step 1708 in FIG. 17, after the selective deposition of the non-cobalt metal cap 302 in the bulk cobalt contact 202, one or more material layers, which can also be referred to as a material stack, are deposited on the non-cobalt metal 302 as shown. These material layers can be used to form an additional metallization layer disposed directly on top of the lower level metallization layer including the non-cobalt metal cap 302 in the bulk cobalt contact 202.

For example, a dielectric etch stop layer 402 is deposited on top of the lower level metallization layer which includes the non-cobalt metal cap 302 in the bulk cobalt contact 202. A next layer of dielectric material 404, such as silicon oxide, carbon doped oxide, or some other low k dielectric, is deposited on the dielectric etch stop layer 402. A patterning hard mask stack 405 may be deposited on top of the layer of dielectric material 404. According to the example, the patterning hard mask stack 405 includes a dielectric such as Silicon Nitride layer 406 disposed on the dielectric material layer 404 and a metal hardmask layer such as Titanium Nitride (TiN) 408 disposed on the Silicon Nitride layer 406. It is understood that the TiN layer 408 is patterned using standard lithographic techniques and is used as a metal hardmask to transfer the lithographic pattern into the dielectric.

Figure 5:
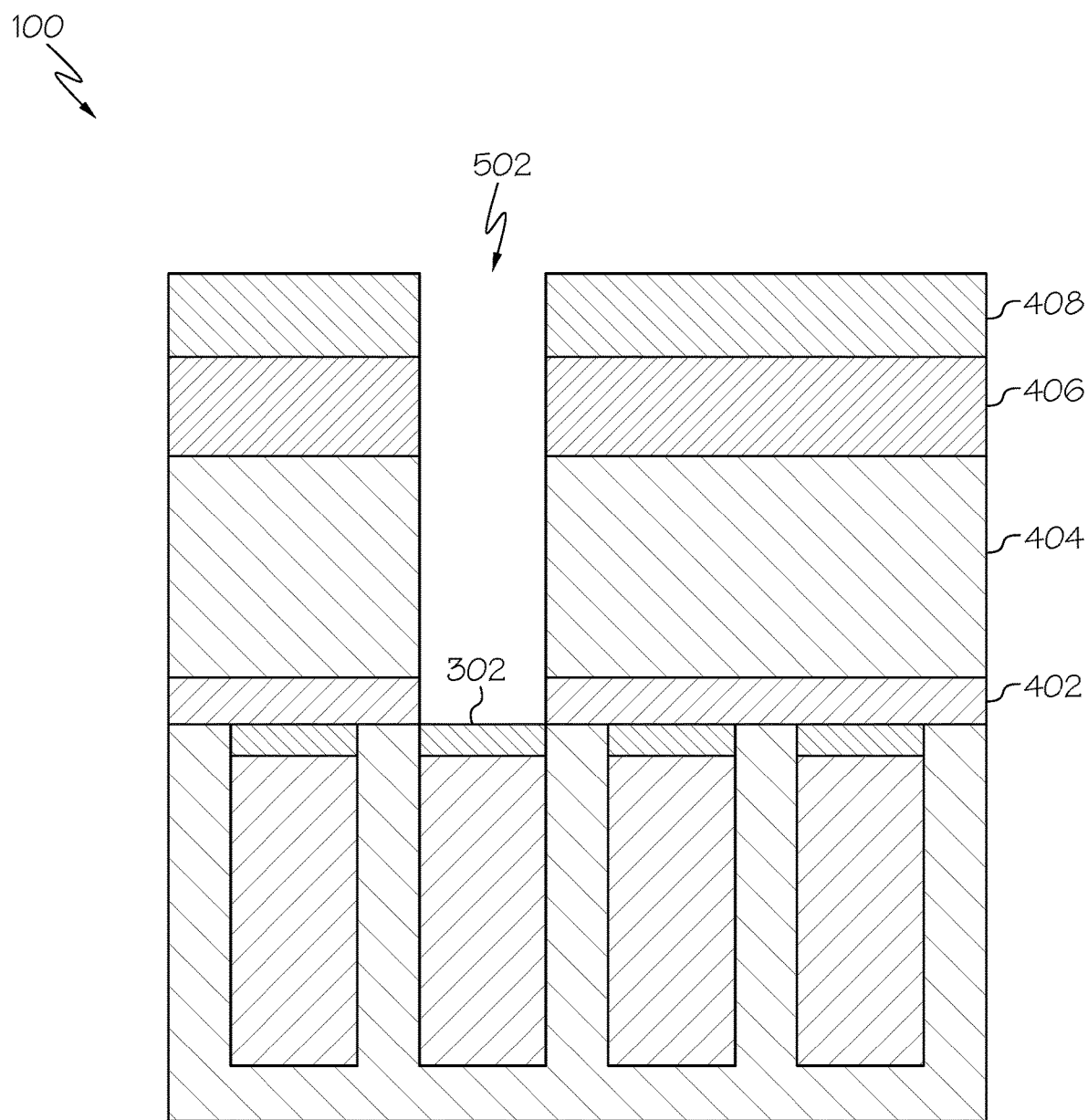
FIG. 5 is a cross-sectional side view of the partial semiconductor structure of FIG. 4 at a subsequent point in the first example fabrication process, according to an embodiment of the invention.

As shown in FIG. 5, a vertical etching process can be used to form a vertical via 502 through the layers 402, 404, 406, 408, of the material stack and exposing the non-cobalt metal cap 302 in the bulk cobalt contact 202 as shown. The vertical etching process can be performed, for example, using a RIE process using a fluoride based chemistry (for example, the chemistry could include mixtures of Ar, $CHF_3$, $C_4F_8$ and $CF_4$, etc.). However, there are many alternative vertical etching processes that could be used.

Figure 6:
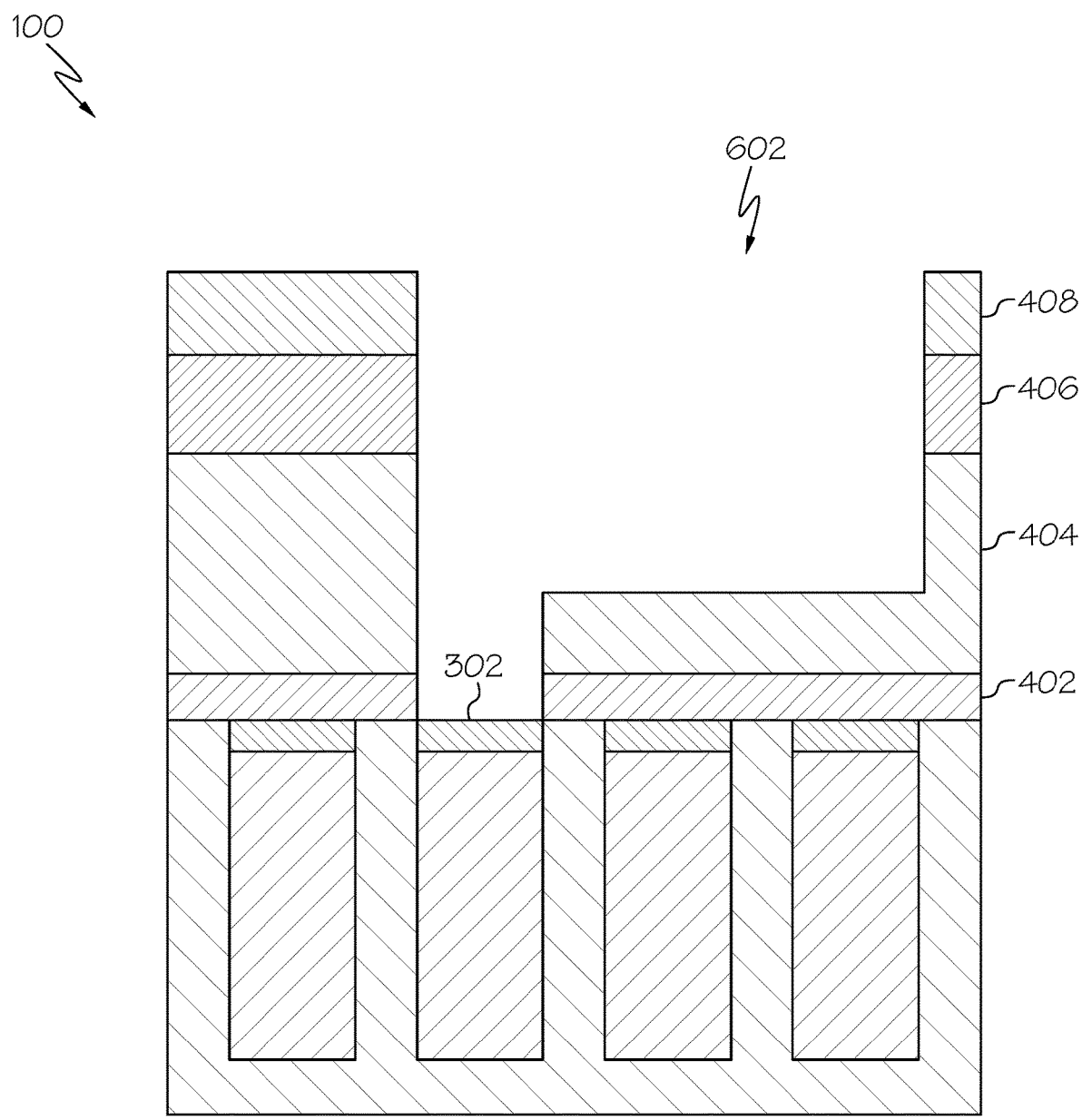
FIG. 6 is a cross-sectional side view of the partial semiconductor structure of FIG. 5 at a subsequent point in the first example fabrication process, according to an embodiment of the invention.

The non-cobalt metal cap 302 protects the underlying Cobalt metal in the bulk cobalt contact 202 from the plasma in the RIE process etching through the material stack 402, 404, 406, 408, to form the via opening 502. Following the formation of the via opening 502, the example fabrication process with reference to FIG. 6, performs an additional trench etching process that forms a vertical trench opening 602 in the layers 404, 406, 408, of the material stack. It is understood that the cross section shown in FIG. 6 is taken from an area different from that shown in FIG. 5, and in FIG. 6 the lithography has transferred the trench pattern to the metal hardmask.

The vertical trench opening 602 includes the vertical via opening 502 in these trench etched layers 404, 406, 408. The width of the vertical trench opening 602 is wider than the width of the vertical via opening 502. The wider width trench opening 602 will accommodate formation of a wider width metal wire interconnect in the higher level metallization layer disposed on top of the lower level metallization layer that includes the replacement metal cap 302 in the bulk cobalt contact 202. At the same time, the vertical via opening 502 is dimensioned to an opening width matching the width of the non-cobalt metal cap 302 and the underlying bulk cobalt contact 202. This arrangement of the vertical via opening 502 and the vertical trench opening 602 allows scaling the Cobalt electrical junction, e.g., the non-cobalt metal cap 302 and the underlying bulk cobalt contact 202, in the lower metallization layer to the miniaturized line width of the semiconductor contact or pad in the underlying semiconductor layers. The wider width trench opening 602, at the same time, allows a semiconductor fabrication process to use wider width metal wire interconnect in the higher level metallization layer. The wider width of the metal wire that will be formed in the vertical trench opening 602 offers a semiconductor chip designer the freedom to use more relaxed metallization layer design constraints in the higher level metallization layer.

For example, Copper metal could be used for this metal wiring in the higher level metallization layer. This wider width metal wire interconnect can effectively couple electrical signals between the semiconductor pad at the top surface region of the semiconductor material stack 103 and, for example, other electronic circuits in a semiconductor chip, while freeing up the circuit designer to use more relaxed metallization layer design constraints to design the wiring interconnect (which may also, according to a particular context, be referred to as metal wire interconnect, electrical interconnect, interconnect, or the like) at the higher level metallization layer.

The vertical etching process, according to the example, may be followed by a wet cleaning process to clean the exposed surfaces in the vertical trench opening 602 and the vertical via opening 502. These wet cleans may or may not include dilute hydrofluoric acid (DHF) and/or chemistries containing oxidizers, such as peroxides. The non-cobalt metal cap 302 protects the underlying Cobalt metal in the bulk cobalt contact 202 from the oxidizing chemicals used in the wet cleaning process.

Figure 7:
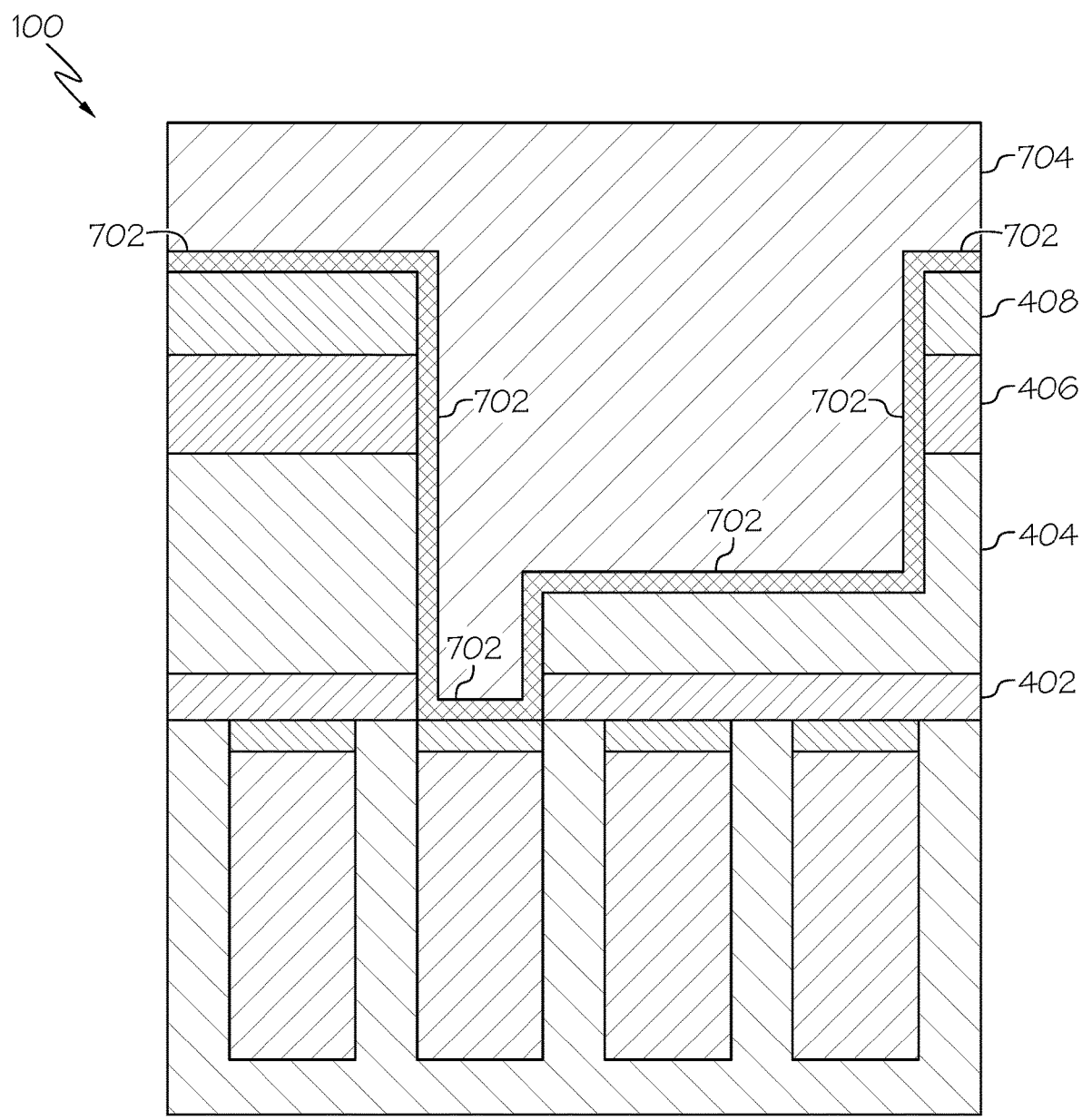
FIG. 7 is a cross-sectional side view of the partial semiconductor structure of FIG. 6 at a subsequent point in the first example fabrication process, according to an embodiment of the invention.

With reference to FIG. 7 and step 1710 in FIG. 17, the example fabrication process continues by forming a next higher level metallization layer in a BEOL metallization stack of metallization layers. A conductive liner/barrier film 702 is formed directly on the exposed surfaces in the vertical trench opening 602 and the vertical via opening 502. Additionally, the conductive liner/barrier film 702 is formed on the top surface of the upper layer 408 of the material stack 402, 404, 406, 408, in the metallization layer.

The conductive liner/barrier film 702 can include, for example, a Tantalum Nitride film deposited and formed across the walls of the vertical trench opening 602 and the vertical via opening 502. The liner/barrier film 702 can be, for example, a conformal Tantalum Nitride, a TaN/Ta bilayer, a Ti or TiN layer, a Co layer, or a Ru layer, or combinations of these materials deposited on the walls of the vertical trench opening 602 and the vertical via opening 502. The liner deposition is primarily by a physical vapor deposition (PVD) technique, though processes such as ALD or CVD can be used as well. The deposition process should perform such that it deposits material on the sidewalls of the material layers 402, 404, 406, 408, as shown in FIG. 7.

After the deposition of a liner/barrier stack film 702 into the vertical trench opening 602 and the vertical via opening 502, as shown in FIG. 7, a deposition of a metal gap fill 704, forms a trench metal contact 704 to complete the metallization of the interconnects. In this example, this is a metal gap fill 704 deposited by PVD Cu seed followed by Cu plating, though chemical vapor deposition (CVD) techniques could be used as well. The metal gap fill 704 can include any metal suitable for forming the metal contact on the conductive liner/barrier film 702 in the vertical trench opening 602 and the vertical via opening 502, as shown in FIG. 7. For example, the metal contact 802 can be made of Copper metal. Several examples of metal that can be used as the metal gap fill 704 include: Copper, Cobalt, and Tungsten metal. However, other metals could also, or alternatively, be used in the metal contact 802, as shown in FIG. 8.

There will be a certain overburden of metal on top of the wafer from the CVD deposition of the metal fill. The semiconductor fabrication process, according to the example, performs a chemical mechanical planarization (CMP) process that polishes and removes the excess metal from the top of the wafer. In the present example, the CMP process also removes the liner/barrier film 702 from the top surface of the upper layer 408 (e.g., the Tantalum Nitride layer 408) of the material stack 402, 404, 406, 408. In the final structure, according to these certain embodiments, liner/barrier film 702 will solely be present in the trench opening which includes the metal contact 802. Compare FIG. 7 to FIG. 8.

Figure 8:
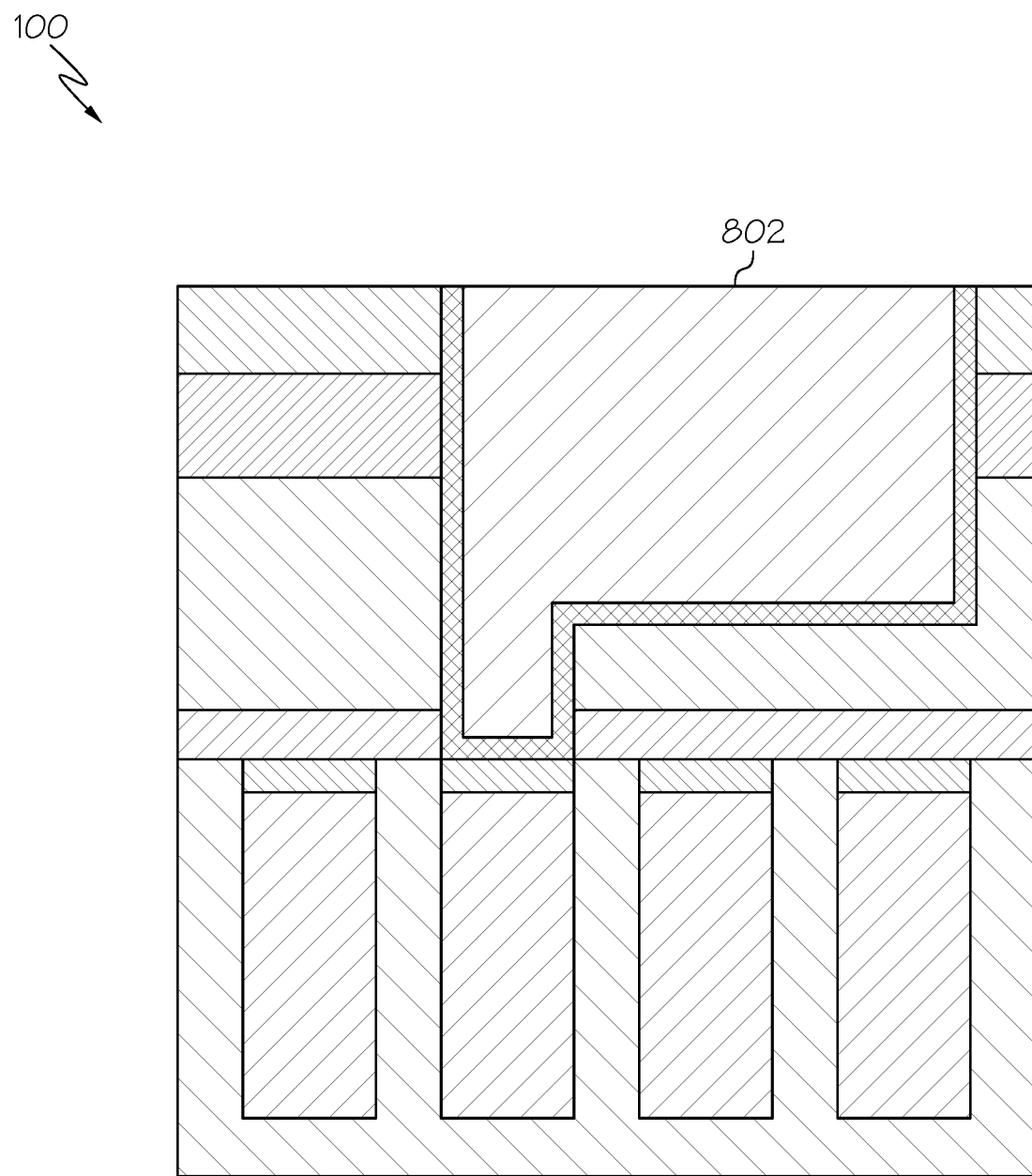
FIG. 8 is a cross-sectional side view of the partial semiconductor structure of FIG. 7 at a subsequent point in the first example fabrication process, according to an embodiment of the invention.

The resulting semiconductor structure, after performing the CMP process in the present example fabrication process, is shown in FIG. 8. The first example semiconductor fabrication process is then exited, at step 1712 in FIG. 17.

A second example semiconductor fabrication process flow diagram 1800, as shown in FIG. 18, which generally corresponds to the process steps shown in FIGS. 9 to 16, will be discussed below. In this second example process flow, a replacement metal cap is selectively deposited on the underlying bulk cobalt contact while building a next higher level metallization layer.

Figure 9:
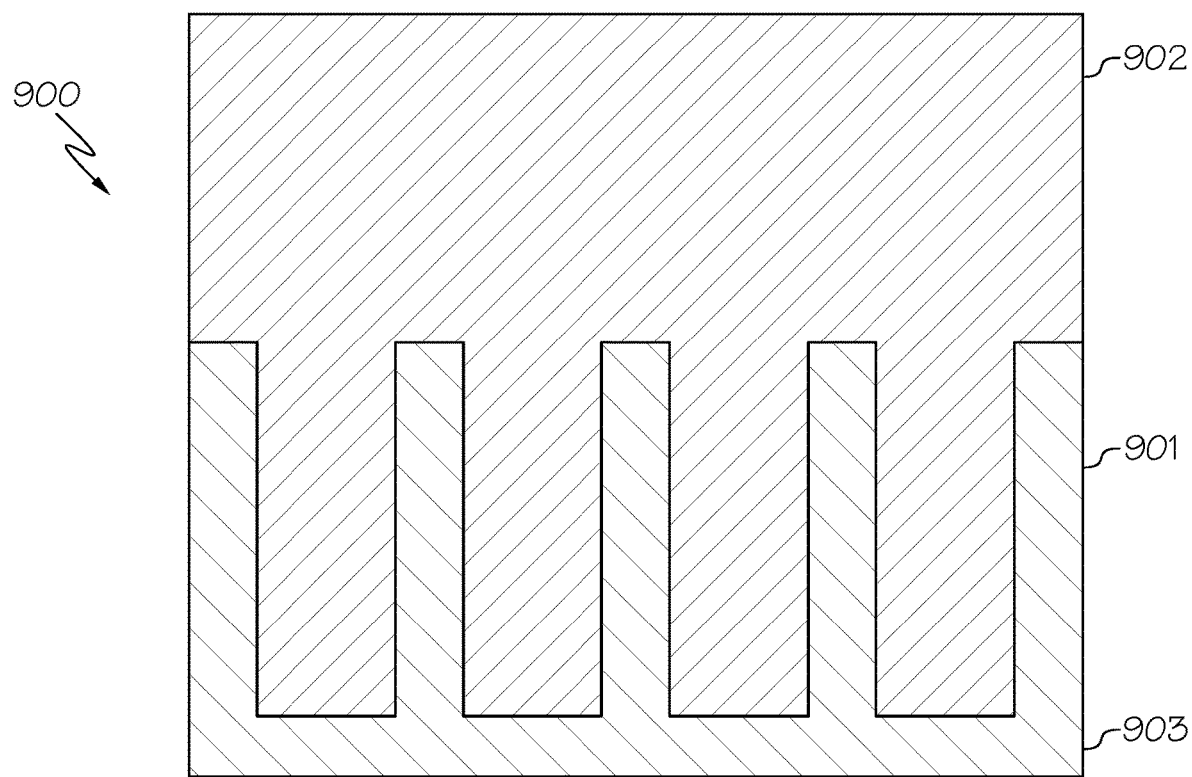
FIG. 9 is a cross-sectional side view of an example of a partial semiconductor structure illustrating a material stack that can be used in a second example fabrication process, according to an embodiment of the invention.

In accordance with the second example semiconductor fabrication process, as shown in FIG. 18, the fabrication flow diagram is entered, at step 1802 and immediately proceeds to step 1804. In a metallization region on a substrate for supporting electronic devices, as shown in FIG. 9, a material layer 901 at a top surface region of a semiconductor material stack 903, according to one example, is patterned with one or more trenches.

According to various embodiments, the substrate may comprise a circuit supporting substrate. A plurality of electronic devices is disposed on the circuit supporting substrate. A first electronic device in the plurality of electronic devices, for example, comprises a first field-effect transistor (FET) and a second electronic device in the plurality of electronic devices comprises a second FET. According to various embodiments of the present invention, an electrical interconnect in a metallization layer on the circuit supporting substrate provides a conductive path for coupling electrical signals between the first FET and the second FET.

The material layer 901 may include, for example, dielectric material such as silicon oxide or carbon-doped oxide, or other low K dielectrics. Various dielectric materials may be used for the patterned top material layer 901, according to various embodiments of the present invention. Such patterning in the material layer 901 may be performed, for example, with a vertical directional etching process. An example of a vertical directional etching process that etches into this material layer 901 is reactive ion etching (RIE) using a fluoride based chemistry (for example, the chemistry could include mixtures of Ar, $CHF_3$, $C_4F_8$ and $CF_4$, etc.). However, there are many alternative vertical etching processes that could be used.

These trenches in the material layer 901 are filled, according to the example, with Cobalt metal fill 902. For example, Cobalt metal can be deposited on the patterned top material layer 901, thereby filling the trenches as shown. Some of the Cobalt metal fill 902 may overflow above the top level of the trenches.

At a top surface region of the semiconductor material stack 903 is provided a semiconductor contact (which may also be referred to as a semiconductor pad, a pad, or the like) within one of the trenches patterned in the top material layer 901. The pad is not shown in FIG. 9. Such semiconductor contact is in direct electrical contact with the bottom surface region of the Cobalt metal fill 902 filling the trench. It should be noted that while there may exist another intervening layer of material (or film) directly on the semiconductor contact or pad, e.g., a pad oxide layer which is not shown, such semiconductor contact is considered in direct electrical contact with the bottom surface region of the Cobalt metal fill 902 filling the trench. The pad oxide layer, for example, could be approximately 30 Å thick.

Figure 10:
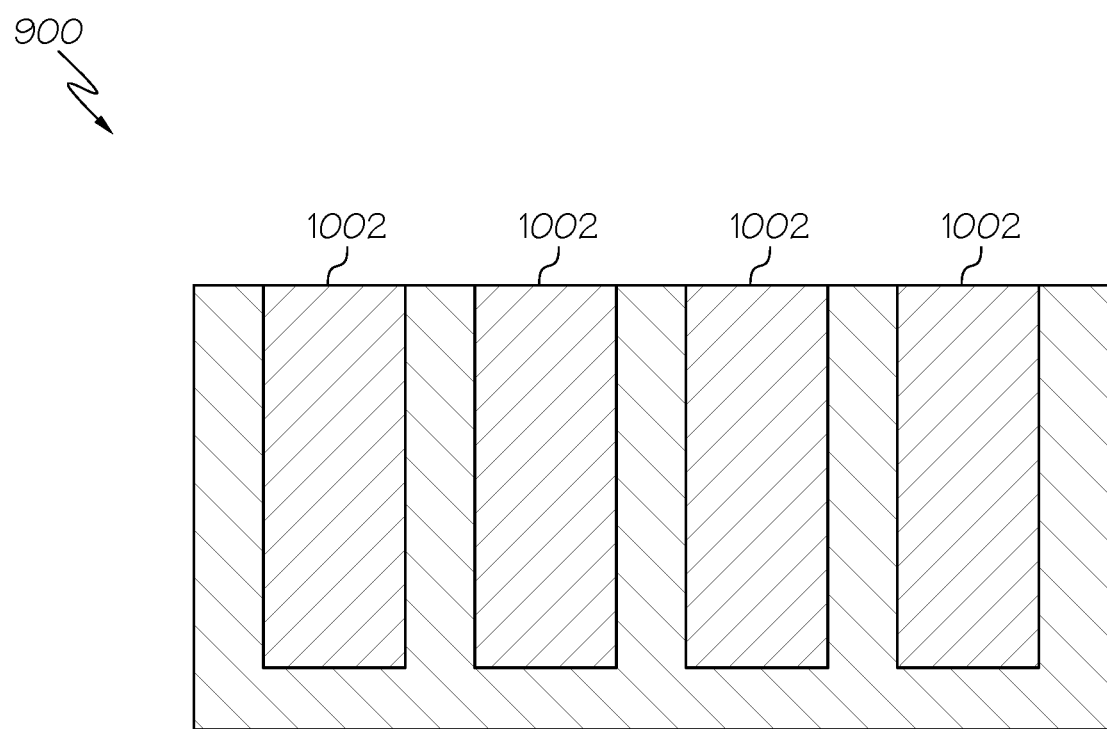
FIG. 10 is a cross-sectional side view of the partial semiconductor structure of FIG. 9 at a subsequent point in the second example fabrication process, according to an embodiment of the invention.
Figure 11:
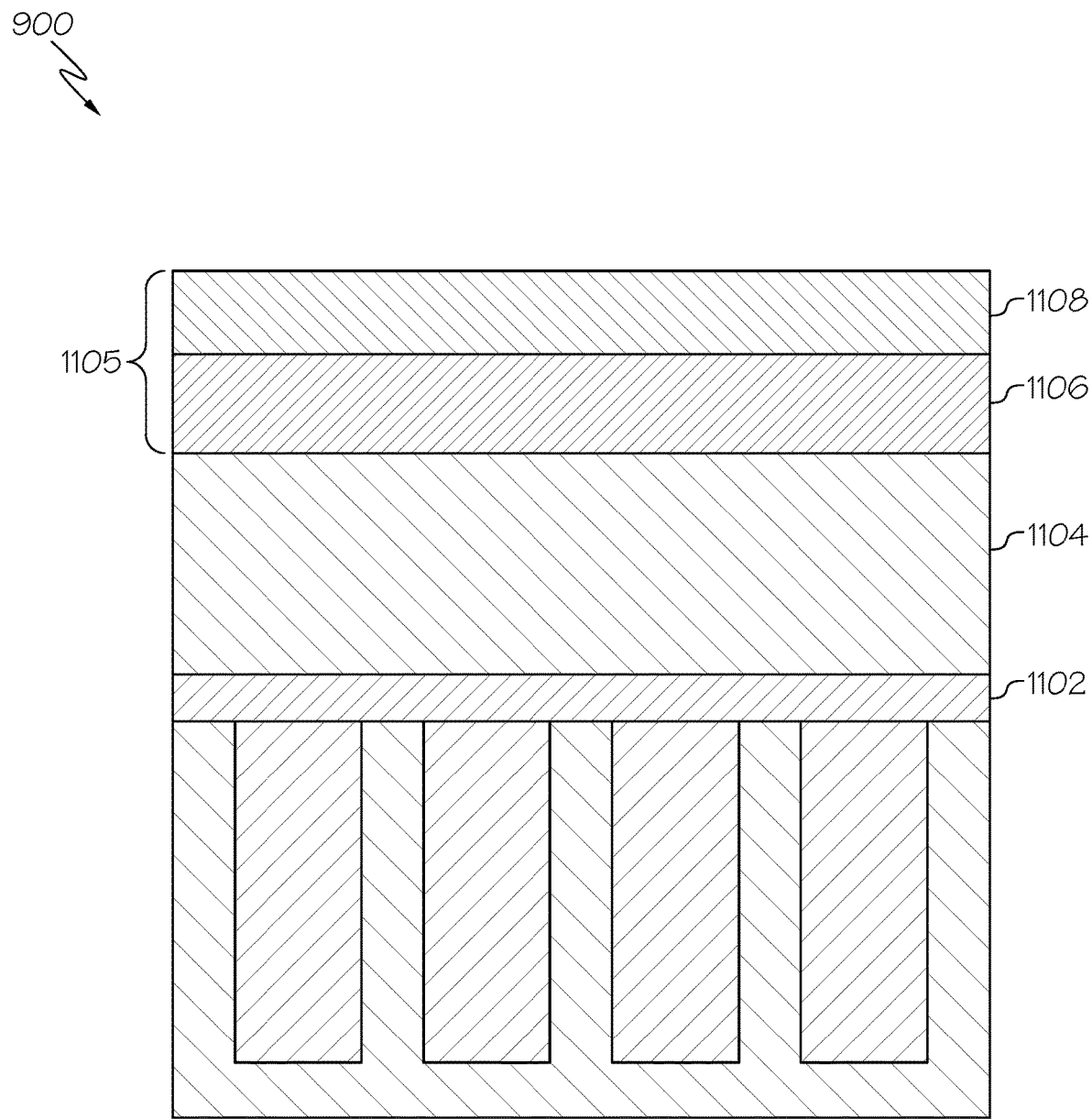
FIG. 11 is a cross-sectional side view of the partial semiconductor structure of FIG. 10 at a subsequent point in the second example fabrication process, according to an embodiment of the invention.

Referring to FIGS. 9 and 10, a fabrication process performs a chemical-mechanical-planarization (CMP) process on the Cobalt metal fill 902 overflowing above the trenches in the material layer 901. The resulting structure is shown in FIG. 10, with one or more trenches filled with the Cobalt metal fill 902 up to the top surface level of the material layer 901. The Cobalt metal fill 902 disposed in a trench and on the semiconductor contact at the top surface region of the semiconductor material stack 903 is also referred to herein as a bulk cobalt contact 1002.

The bulk cobalt contact 1002 in the trench formed in the top material layer 901 provides a metal contact in a metallization layer which can include the material layer 901 alone or with additional layers. This bulk cobalt contact 1002 is a metal contact for the semiconductor contact or pad at the top surface region of the semiconductor material stack 903.

The semiconductor contact provides a conductive path for electrical current to flow vertically between a semiconductor circuit in the semiconductor material stack 903 and the bulk cobalt contact 1002 in the metallization layer disposed above the material stack 903. The semiconductor contact and the bulk cobalt contact 1002 are dimensioned to a similar width according to a miniaturization scale of line width in the semiconductor circuit in the underlying semiconductor stack 903.

A dielectric etch stop layer 1102 is deposited on top of the lower level metallization layer which includes the bulk cobalt contact 1002. A next layer of dielectric material 1104, such as silicon oxide, carbon doped oxide, or some other low k dielectric, is deposited on the dielectric etch stop layer 1102. A patterning hard mask stack 1105 may be deposited on top of the layer of dielectric material 1104. According to the example, the patterning hard mask stack 1105 includes a dielectric such as Silicon Nitride layer 1106 disposed on the dielectric material layer 1104 and a metal hardmask layer such as Titanium Nitride (TiN) 1108 disposed on the Silicon Nitride layer 1106. It is understood that the TiN layer 1108 is patterned using standard lithographic techniques and is used as a metal hardmask to transfer the lithographic pattern into the dielectric.

Figure 12:
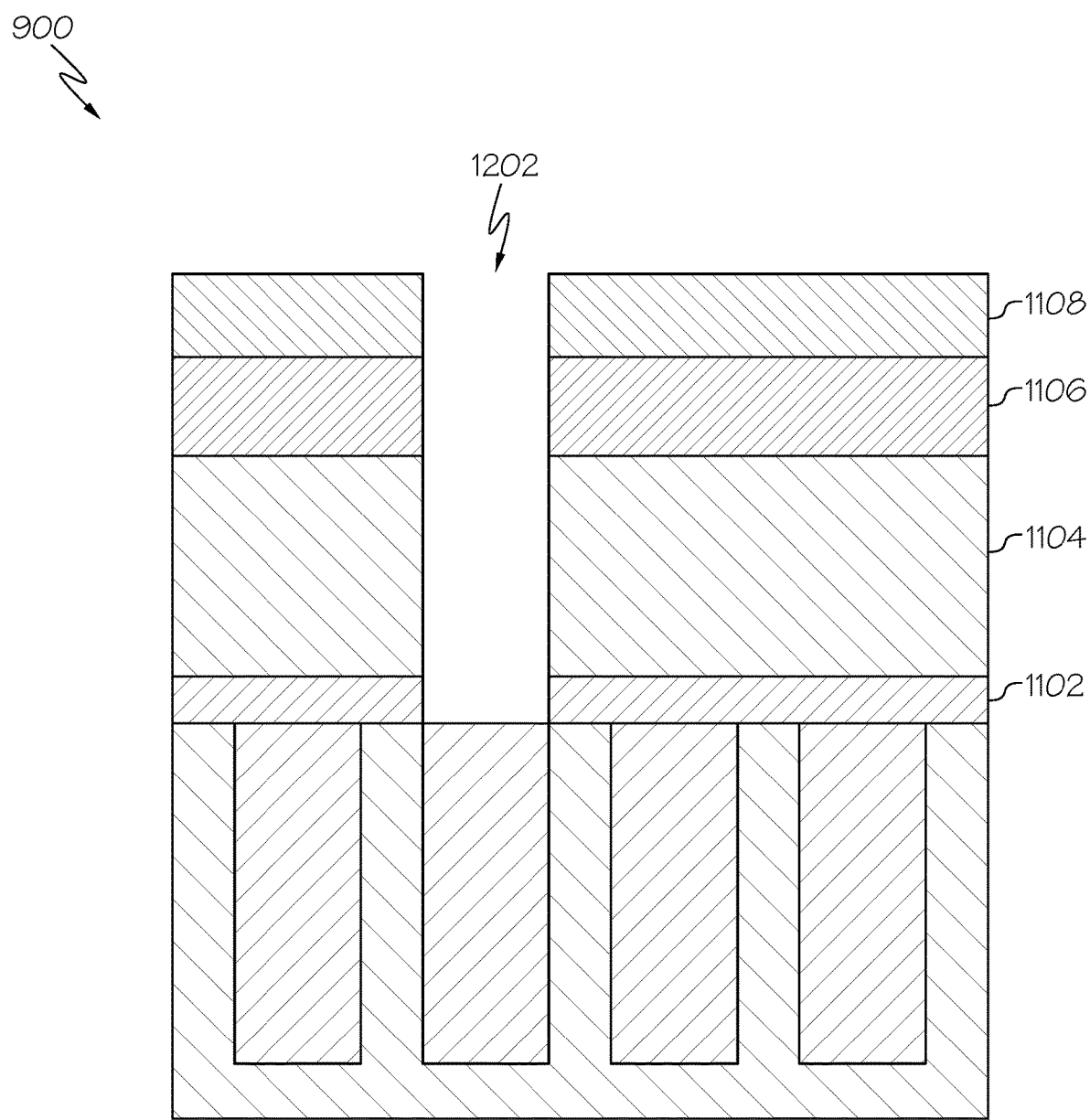
FIG. 12 is a cross-sectional side view of the partial semiconductor structure of FIG. 11 at a subsequent point in the second example fabrication process, according to an embodiment of the invention.

As shown in FIG. 12, a vertical etching process can be used to form a vertical via 1202 through the layers 1102, 1104, 1106, 1108, of the material stack and exposing the bulk cobalt contact 1002 as shown. The vertical etching process can be performed, for example, using a RIE process using a fluoride based chemistry (for example, the chemistry could include mixtures of Ar, $CHF_3$, $C_4F_8$ and $CF_4$, etc.). However, there are many alternative vertical etching processes that could be used.

Figure 13:
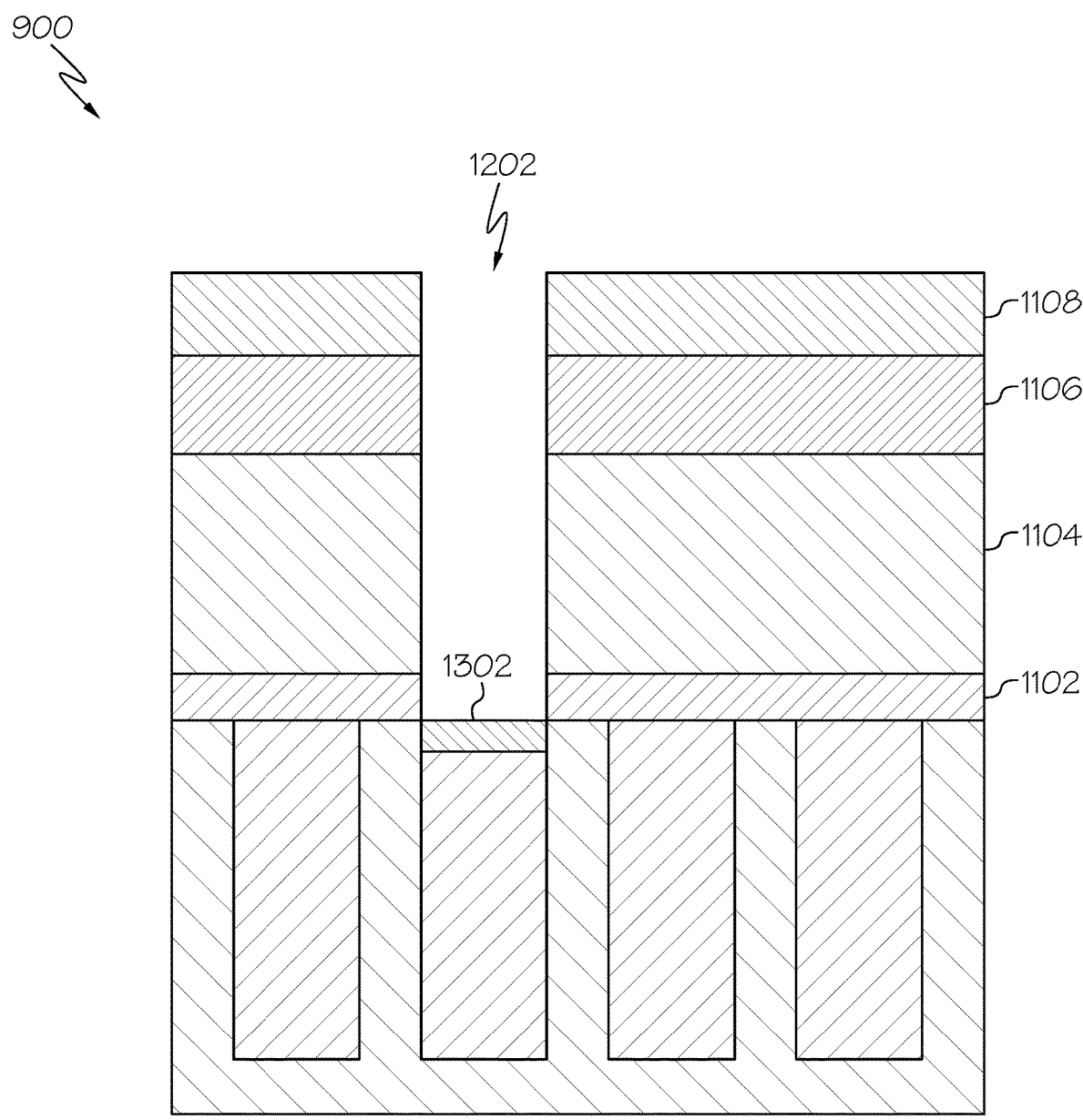
FIG. 13 is a cross-sectional side view of the partial semiconductor structure of FIG. 12 at a subsequent point in the second example fabrication process illustrating formation, by a chemical exchange reaction of metal between a non-cobalt metal and Cobalt in a bulk cobalt contact, of a non-cobalt metal cap integrally formed in a top surface region of the bulk cobalt contact, according to an embodiment of the invention.

Referring to FIGS. 12 and 13, and to step 1808 shown in FIG. 18, the second example semiconductor fabrication process proceeds to perform selective deposition of a non-cobalt metal cap 1302 (which may be also referred to as a replacement non-cobalt metal cap, a replacement metal cap, a replacement cap, or the like) integrally formed in a top surface region of the bulk cobalt contact 1002, as shown in FIG. 13. This selective deposition can be performed by a chemical exchange reaction of metal between a non-cobalt metal and Cobalt metal in the bulk cobalt contact 1002, as further described below.

A wet chemical solution, according to one example process, contains a metal species that is more noble (less reactive) than Cobalt metal. The metal species, obviously, would be a metal that is other than Cobalt metal. A wet chemistry in the chemical solution includes metal ions of the more noble metal species. Examples of metal species more noble (less reactive) than Cobalt include, but are not limited to: Copper, Ruthenium, Rhodium, Platinum, Iridium, Osmium, Palladium, or Rhenium.

While the present example is discussed using only one nobler non-cobalt metal species in the wet chemical solution, it should be clear that a plurality of nobler non-cobalt metal species can also be used in a wet chemical solution, according to various embodiments of the invention. That is, a plurality of metal species could take part in the chemical exchange reaction of metal between non-cobalt metal in the wet chemical solution and the Cobalt metal in the bulk cobalt contact 1002, according to such various embodiments of the invention.

The wet chemical solution containing the metal species, more noble than Cobalt metal, drives the chemical exchange reaction of metal between the non-cobalt metal and the Cobalt metal in the bulk cobalt contact 1002. A thin layer (or film) 1302 of the nobler non-cobalt metal is selectively deposited and integrally formed in a top surface region of the bulk cobalt contact 1002, by a metal exchange (or replacement) reaction in which the nobler metal ions in the wet chemical solution are exchanged with, and replace, atoms of Cobalt in the top surface region of the bulk cobalt contact 1002. The replaced atoms of Cobalt become ions of Cobalt in the wet chemical solution, and contemporaneously the nobler metal ions become integrally formed in the top surface region of the bulk cobalt contact 1002 as a replacement metal cap 1302 made of the nobler non-cobalt metal.

This metal exchange chemical reaction is very selective to the Cobalt metal in the bulk cobalt contact 1002, in that the non-cobalt nobler metal ions will only exchange one-for-one with the atoms of Cobalt metal in the top surface region of the bulk cobalt contact 1002. This metal exchange chemical reaction is also self-limiting. Once the top surface region of the bulk cobalt contact 1002 is completely passivated with the film 1302 made of the non-cobalt nobler metal, the driving force for the metal exchange chemical reaction subsides. The resulting non-cobalt nobler metal cap 1302 protects the underlying Cobalt metal in the bulk cobalt contact 1002 and prevents any further metal exchange chemical reaction with the remaining Cobalt metal in the bulk cobalt contact 1002.

It should be noted that the non-cobalt metal cap 1302 is not deposited "on top of" the top surface of the bulk cobalt contact 1002. This metal exchange chemical reaction is very different from other material deposition processes, such as chemical vapor deposition (CVD) or Electroless deposition. The non-cobalt metal cap 1302 is integrally formed in the Cobalt metal of the bulk cobalt contact. That is, the non-cobalt metal ions will exchange one-for-one with the atoms of Cobalt in the top surface region of the bulk cobalt contact 1002 integrally forming the non-cobalt metal cap 1302 in the bulk cobalt contact 1002.

Figure 14:
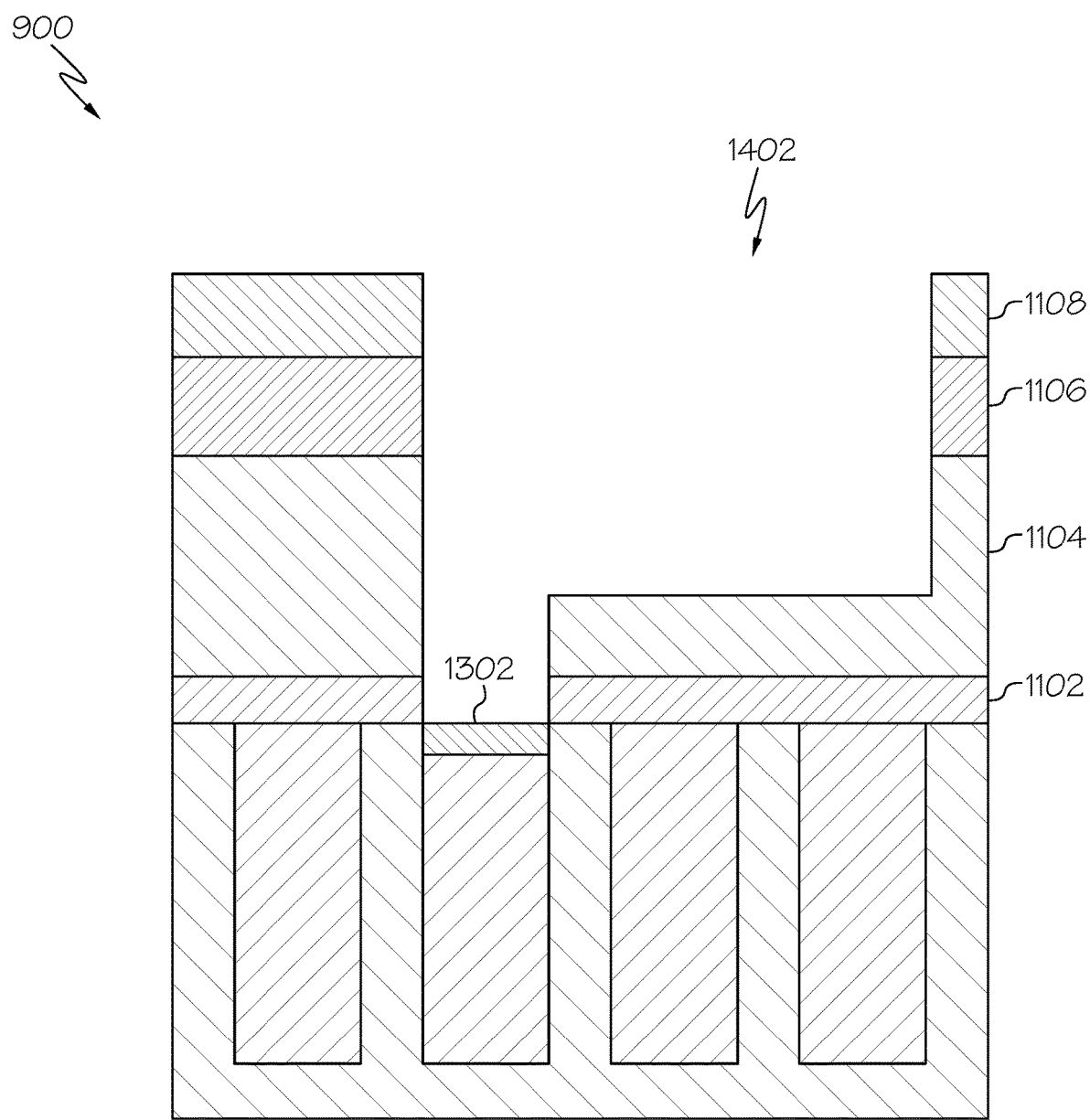
FIG. 14 is a cross-sectional side view of the partial semiconductor structure of FIG. 13 at a subsequent point in the second example fabrication process, according to an embodiment of the invention.

Following the formation of the via opening 1202 and the selective deposition of the replacement metal cap 1302 in the bulk cobalt contact 1002, the example fabrication process with reference to FIG. 14, performs an additional trench etching process that forms a vertical trench opening 1402 in the layers 1104, 1106, 1108, of the material stack. It is understood that the cross section shown in FIG. 14 is taken from an area different from that shown in FIG. 12, and in FIG. 14 the lithography has transferred the trench pattern to the metal hardmask. The vertical trench opening 1402 includes the vertical via opening 1302 in these trench etched layers 1104, 1106, 1108. The width of the vertical trench opening 1402 is wider than the width of the vertical via opening 1302. The wider width trench opening 1402 will accommodate formation of a wider width metal wire interconnect in the higher level metallization layer disposed on top of the lower level metallization layer that includes the replacement metal cap 1302 in the bulk cobalt contact 1002. At the same time, the vertical via opening 1202 is dimensioned to an opening width matching the width of the replacement non-cobalt metal cap 1302 and the underlying bulk cobalt contact 1002. This arrangement of the vertical via opening 1202 and the vertical trench opening 1402 allows scaling the Cobalt electrical junction, e.g., the non-cobalt metal cap 1302 and the underlying bulk cobalt contact 1002, in the lower metallization layer to the miniaturized line width of the semiconductor contact or pad in the underlying semiconductor layers 903. The wider width trench opening 1402, at the same time, allows a semiconductor fabrication process to use wider width metal wire interconnect in the higher level metallization layer. The wider width of the metal wire that will be formed in the vertical trench opening 1402 offers a semiconductor chip designer the freedom to use more relaxed metallization layer design constraints in the higher level metallization layer.

For example, Copper metal could be used for this metal wiring in the higher level metallization layer. This wider width metal wire interconnect can effectively couple electrical signals between the semiconductor pad at the top surface region of the semiconductor material stack 903 and, for example, other electronic circuits in a semiconductor chip, while freeing up the circuit designer to use more relaxed metallization layer design constraints to design the wiring interconnect at the higher level metallization layer.

The vertical etching process, according to the example, may be followed by a wet cleaning process to clean the exposed surfaces in the vertical trench opening 1402 and the vertical via opening 1202. These wet cleans may or may not include dilute hydrofluoric acid (DHF) and/or chemistries containing oxidizers, such as peroxides. The non-cobalt metal cap 1302 protects the underlying Cobalt metal in the bulk cobalt contact 1002 from the oxidizing chemicals used in the wet cleaning process.

Figure 15:
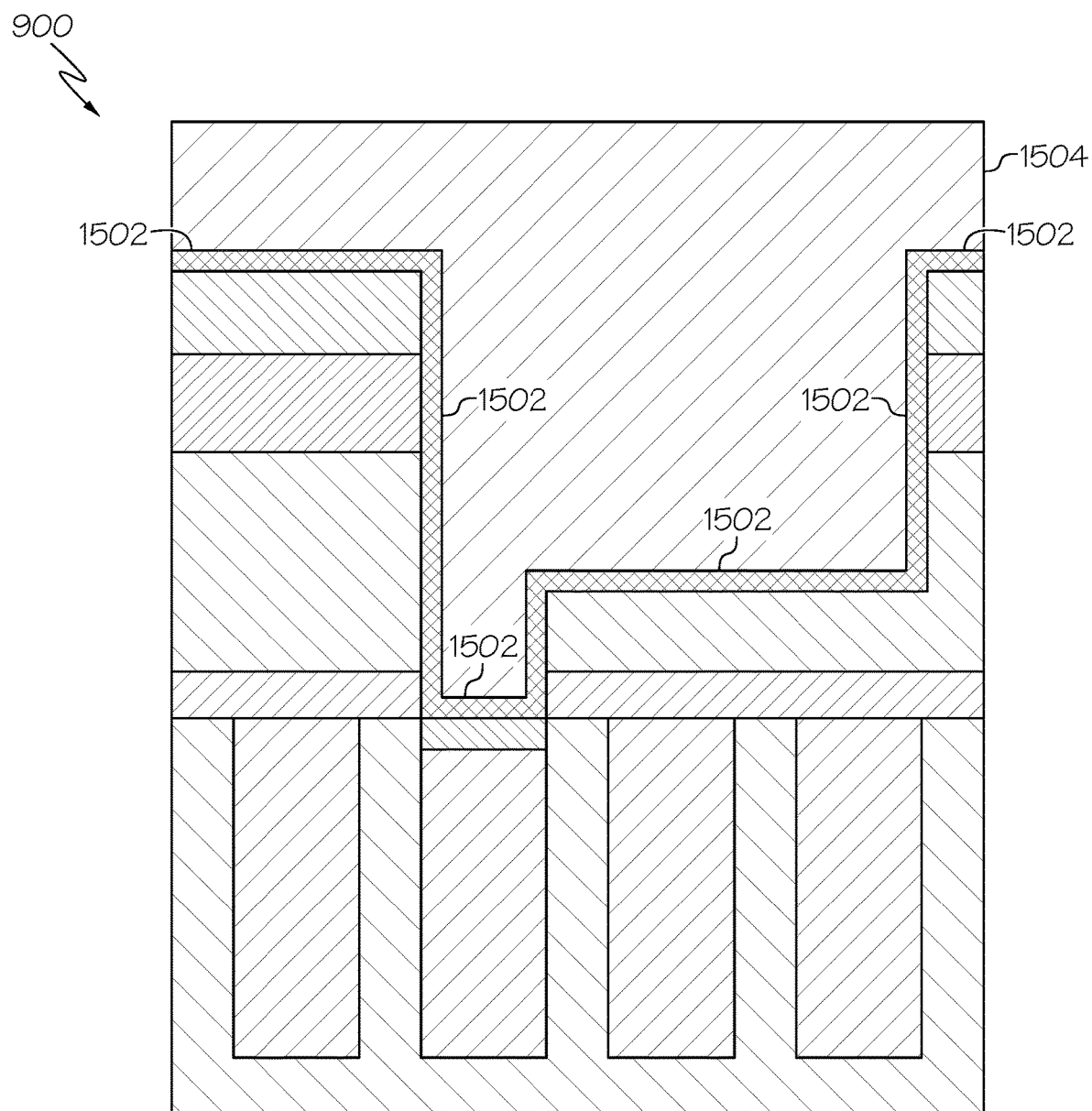
FIG. 15 is a cross-sectional side view of the partial semiconductor structure of FIG. 14 at a subsequent point in the second example fabrication process, according to an embodiment of the invention.

With reference to FIG. 15 and to step 1810 in FIG. 18, the example fabrication process continues by forming a next higher level metallization layer in a BEOL metallization stack of metallization layers. A conductive liner/barrier film 1502 is formed directly on the exposed surfaces in the vertical trench opening 1402 and the vertical via opening 1202. Additionally, the conductive liner/barrier film 1502 is formed on the top surface of the upper layer 1108 of the material stack 1102, 1104, 1106, 1108, in the metallization layer.

The conductive liner/barrier film 1502 can include, for example, a Tantalum Nitride film deposited and formed across the walls of the vertical trench opening 1402 and the vertical via opening 1202. The liner/barrier film 1502 can be, for example, a conformal Tantalum Nitride, a TaN/Ta bilayer, a Ti or TiN layer, a Co layer, or a Ru layer, or combinations of these materials deposited on the walls of the vertical trench opening 1402 and the vertical via opening 1202. The liner deposition is primarily by a physical vapor deposition (PVD) technique, though processes such as ALD or CVD can be used as well. The deposition process should perform such that it deposits material on the sidewalls of the material layers 1102, 1104, 1106, 1108, as shown in FIG. 15.

After the deposition of a liner/barrier film 1502 into the vertical trench opening 1402 and the vertical via opening 1202, as shown in FIG. 15, a deposition of a metal gap fill 1504, forms a trench metal contact 1602 to complete the metallization of the interconnects. In this example, this is a metal fill 1504 deposited by PVD Cu seed followed by Cu plating, though chemical vapor deposition (CVD) techniques could be used as well. The metal gap fill 1504 can include any metal suitable for forming the metal contact on the conductive liner/barrier film 1502 in the vertical trench opening 1402 and the vertical via opening 1202, as shown in FIG. 15. For example, the metal contact 1602 can be made of Copper metal. Several examples of metal that can be used as the metal gap fill 1504 include: Copper, Cobalt, and Tungsten metal. However, other metals could also, or alternatively, be used in the metal contact 1602, as shown in FIG. 16.

There will be a certain overburden of metal on top of the wafer from the CVD deposition of the metal fill. The semiconductor fabrication process, according to the example, performs a chemical mechanical planarization (CMP) process that polishes and removes the excess metal from the top of the wafer. In the present example, the CMP process also removes the liner/barrier film 1502 from the top surface of the upper layer 1108 (e.g., the Tantalum Nitride layer 1108) of the material stack 1102, 1104, 1106, 1108. In the final structure, according to these certain embodiments, liner/barrier film 1502 will solely be present in the trench opening which includes the metal contact 1602. Compare FIG. 15 to FIG. 16.

Figure 16:
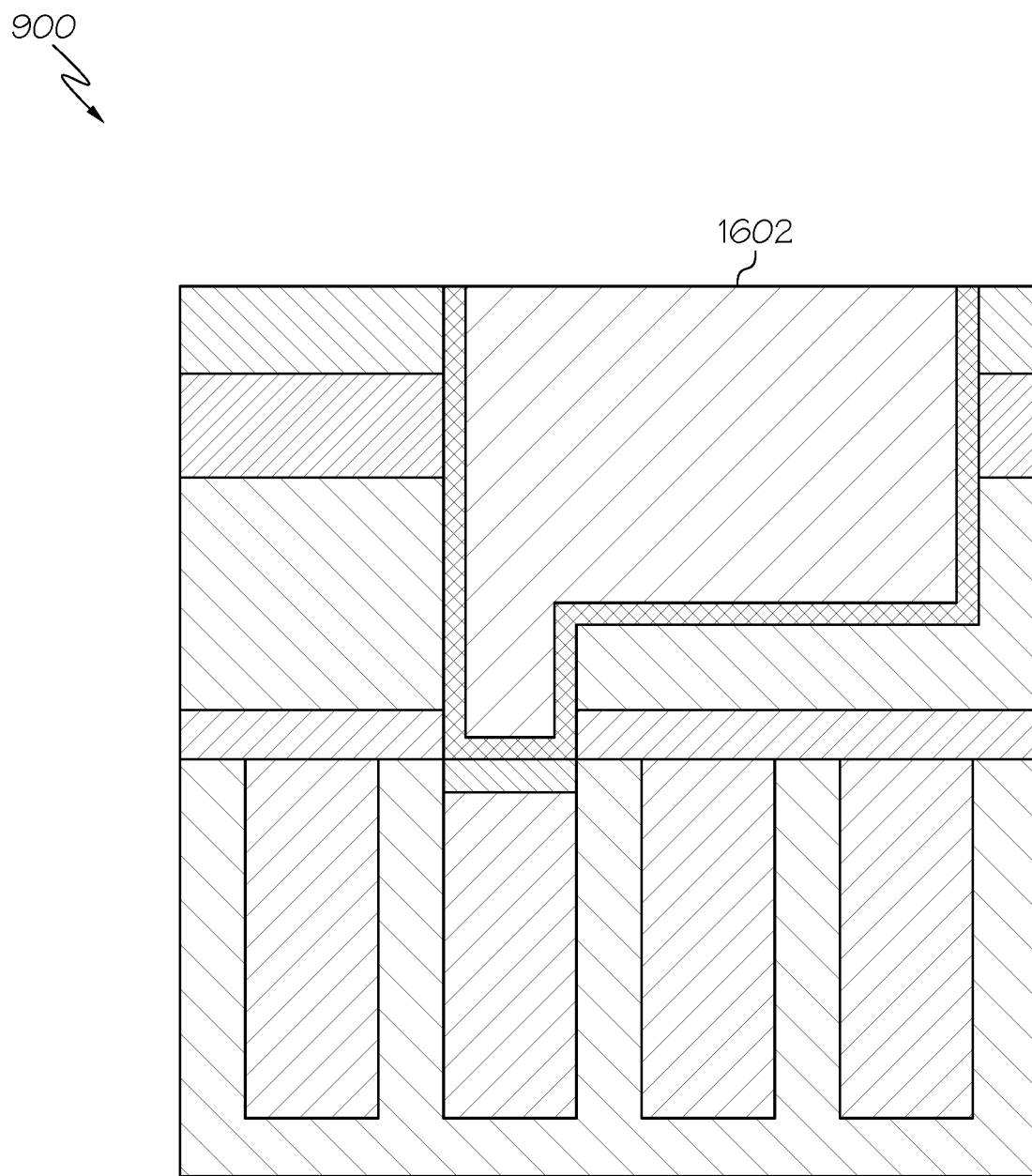
FIG. 16 is a cross-sectional side view of the partial semiconductor structure of FIG. 15 at a subsequent point in the second example fabrication process, according to an embodiment of the invention.

The resulting semiconductor structure, after performing the CMP process in the present example fabrication process, is shown in FIG. 16. The second example semiconductor fabrication process is then exited, at step 1812 in FIG. 18.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
   a substrate; and
   a first BEOL metallization layer disposed on the substrate, the first BEOL metallization layer including at least one bulk cobalt contact, the at least one bulk cobalt contact including a replacement non-cobalt metal cap integrally formed only in the cobalt metal of the at least one bulk cobalt contact and not deposited on top of a top surface of the bulk cobalt contact.

2. The semiconductor structure of claim 1, wherein the replacement non-cobalt metal cap comprises a non-cobalt metal film integrally formed in the bulk cobalt contact at a top surface of the bulk cobalt contact.

3. A semiconductor structure comprising:
   a substrate;
   a first BEOL metallization layer disposed on the substrate, the first BEOL metallization layer including at least one bulk cobalt contact, the at least one bulk cobalt contact including a replacement non-cobalt metal cap integral to the at least one bulk cobalt contact; and
   a second BEOL metallization layer disposed on the first BEOL metallization layer, the second BEOL metallization including:
     a conductive liner disposed directly on the replacement non-cobalt metal cap integral to the bulk cobalt contact in the first BEOL metallization layer.

4. The semiconductor structure of claim 3, wherein the second BEOL metallization layer further including:
   a metal contact disposed directly on the conductive liner, and thereby disposed on the replacement non-cobalt metal cap integral to the bulk cobalt contact in the first BEOL metallization layer.

5. The semiconductor structure of claim 4, wherein the metal contact comprises a metal selected from the following set of metals:
- Copper (Cu); or
- Cobalt (Co).

6. The semiconductor structure of claim 1, wherein the replacement non-cobalt metal cap comprises a metal that is nobler than Cobalt.

7. The semiconductor structure of claim 1, wherein the replacement non-cobalt metal cap comprises a metal, other than Cobalt, that is selective to Cobalt in the at least one bulk cobalt contact in a metal exchange chemical reaction.

8. The semiconductor structure of claim 1, wherein the replacement non-cobalt metal cap comprises a metal, other than Cobalt, that passivates a top surface of the bulk cobalt contact.

9. The semiconductor structure of claim 1, wherein the replacement non-cobalt metal cap comprises at least one metal selected from the following set of metals:
- Copper (Cu);
- Ruthenium (Ru);
- Rhodium (Rh);
- Platinum (Pt);
- Iridium (Ir);
- Osmium (Os);
- Palladium (Pd); or
- Rhenium (Re).

10. The semiconductor structure of claim 1, wherein the substrate comprises a circuit supporting substrate, and the semiconductor structure further comprising:
a plurality of electronic devices disposed on the circuit supporting substrate, a first electronic device in the plurality of electronic devices comprising a first field-effect transistor (FET) and a second electronic device in the plurality of electronic devices comprising a second FET, the at least one bulk cobalt contact including the replacement non-cobalt metal cap integral to the at least one bulk cobalt contact, providing an electrical interconnect in the first BEOL metallization layer between the first FET and the second FET.

11. The semiconductor structure of claim 1, wherein the semiconductor structure is part of a semiconductor wafer for fabricating any one or more of: discrete semiconductor electronic devices, semiconductor integrated circuits, or CMOS integrated circuits.

* * * * *